(12) United States Patent
Takabayashi et al.

(10) Patent No.: US 9,601,906 B2
(45) Date of Patent: Mar. 21, 2017

(54) WAVELENGTH-TUNABLE LIGHT SOURCE AND WAVELENGTH-TUNABLE LIGHT SOURCE MODULE

(71) Applicant: Mitsubishi Electric Corporation, Chiyoda-ku (JP)

(72) Inventors: Masakazu Takabayashi, Tokyo (JP); Yuichiro Horiguchi, Tokyo (JP); Mitsunobu Gotoda, Tokyo (JP); Eitaro Ishimura, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/014,741

(22) Filed: Feb. 3, 2016

(65) Prior Publication Data

US 2016/0233642 A1    Aug. 11, 2016

(30) Foreign Application Priority Data

Feb. 9, 2015 (JP) ................................ 2015-022821
Dec. 9, 2015 (JP) ................................ 2015-239935

(51) Int. Cl.
*H01S 5/026* (2006.01)
*G02B 6/12* (2006.01)
(Continued)

(52) U.S. Cl.
CPC ........ *H01S 5/5027* (2013.01); *G02B 6/12004* (2013.01); *H01S 5/026* (2013.01);
(Continued)

(58) Field of Classification Search
CPC ...... H01S 5/026; H01S 5/1092; H01S 5/5027; G02B 6/12004
See application file for complete search history.

(56) References Cited

U.S. PATENT DOCUMENTS 5,394,489 A * 2/1995 Koch ................. G02B 6/12004
257/E27.128
5,805,755 A * 9/1998 Amersfoort ........ G02B 6/12004
372/46.012
(Continued)

FOREIGN PATENT DOCUMENTS

JP    2003-215369    7/2003
JP    2003-258368    9/2003
(Continued)

*Primary Examiner* — Daniel Petkovsek
(74) *Attorney, Agent, or Firm* — Oblon, McClelland, Maier & Neustadt, L.L.P.

(57) ABSTRACT

A first arm portion and a second arm portion are provided so as to have a distance therebetween greater than a distance between input ends of two output waveguides and greater than a distance between an output end of a first output portion and an output end of a second output portion, the first arm portion forming a traveling path of light from one of the two output waveguides to the first output portion through a first optical amplifier, the second arm portion forming a traveling path of light from another one of the two output waveguides to the second output portion through a second optical amplifier. The first optical amplifier and the second optical amplifier have curved portions in which the first output portion and the second output portion are curved in a direction toward each other, and the first optical amplifier and the second optical amplifier respectively output light from the output end of the first output portion and the output end of the second output portion.

13 Claims, 17 Drawing Sheets

(51) Int. Cl.
*H01S 5/50* (2006.01)
*H01S 5/10* (2006.01)
*H01S 5/024* (2006.01)
*H01S 5/12* (2006.01)
*H01S 5/40* (2006.01)

(52) U.S. Cl.
CPC .......... *H01S 5/0265* (2013.01); *H01S 5/1092* (2013.01); *H01S 5/4087* (2013.01); *H01S 5/0261* (2013.01); *H01S 5/02415* (2013.01); *H01S 5/12* (2013.01); *H01S 5/4031* (2013.01); *H01S 5/50* (2013.01)

(56) References Cited

U.S. PATENT DOCUMENTS

| | | | | |
|---|---|---|---|---|
| 5,999,283 A | * | 12/1999 | Roberts | G02F 3/00 359/108 |
| 6,208,454 B1 | * | 3/2001 | Koren | G02F 2/004 359/326 |
| 6,392,751 B1 | * | 5/2002 | Koch | G02B 6/12 356/477 |
| 6,570,697 B2 | * | 5/2003 | Martinez | H04L 7/0075 359/238 |
| 6,614,582 B1 | * | 9/2003 | Mikkelsen | G02F 2/004 359/326 |
| 7,228,019 B2 | | 6/2007 | Takahashi | |
| 7,633,988 B2 | * | 12/2009 | Fish | G02B 6/12 372/20 |
| 9,013,785 B2 | * | 4/2015 | Whitbread | H01S 5/06256 359/344 |

FOREIGN PATENT DOCUMENTS

| | | |
|---|---|---|
| JP | 2005-156855 | 6/2005 |
| JP | 2007-65357 | 3/2007 |
| JP | 2009-224348 | 10/2009 |
| JP | 2011-44581 | 3/2011 |
| JP | 2014-165377 | 9/2014 |

* cited by examiner

F I G. 3
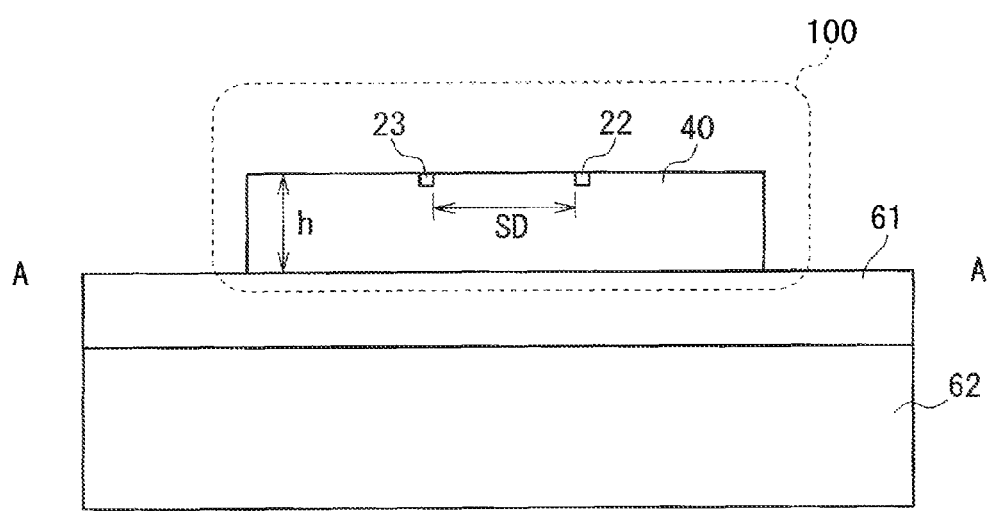

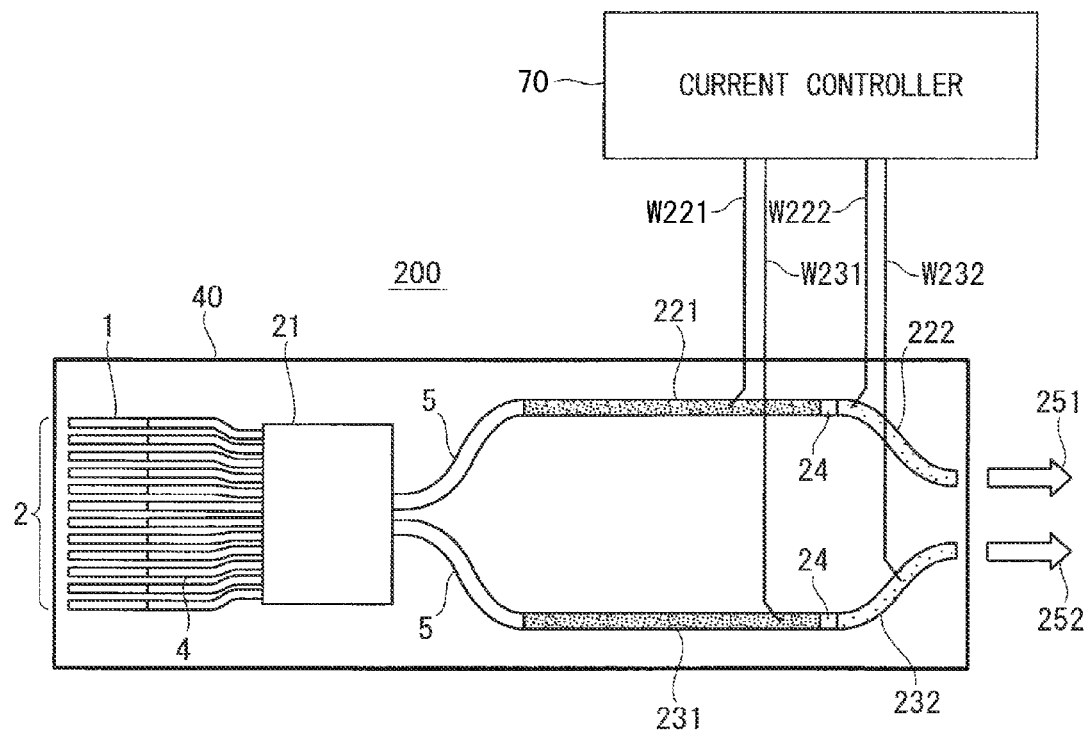
F I G. 9

F I G. 1 4
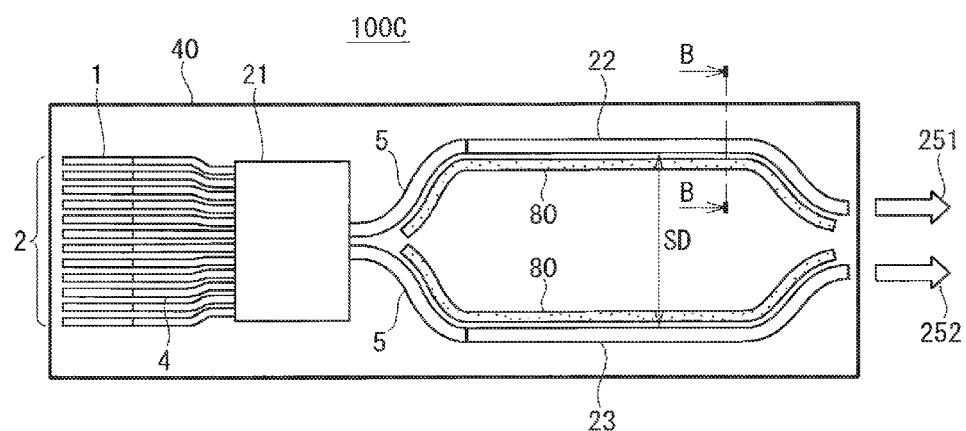
F I G. 1 5
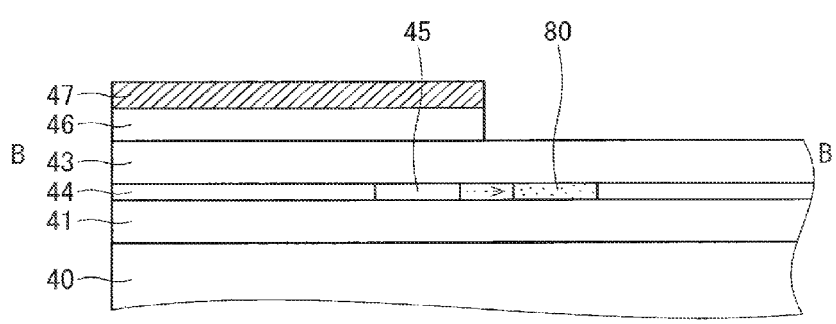

F I G. 1 8
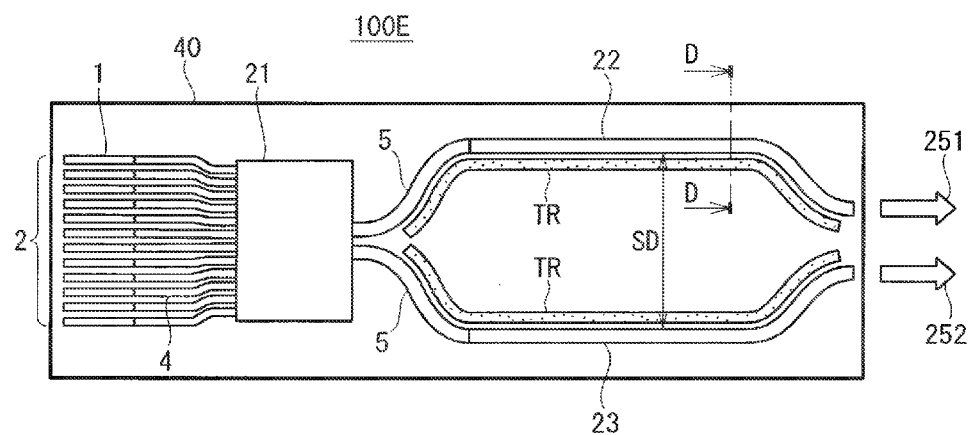
F I G. 1 9
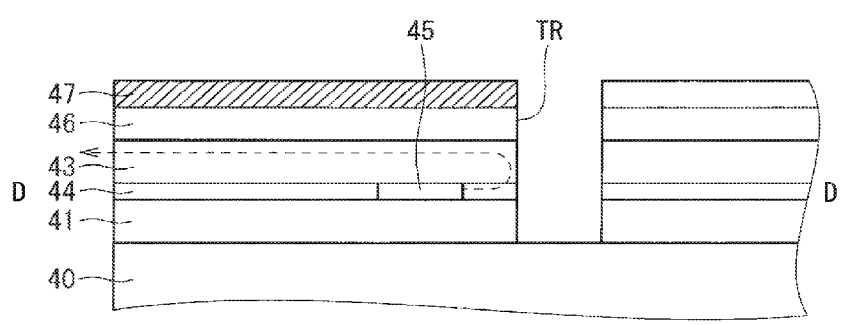

WAVELENGTH-TUNABLE LIGHT SOURCE AND WAVELENGTH-TUNABLE LIGHT SOURCE MODULE

BACKGROUND OF THE INVENTION

Field of the Invention

The present invention relates to a wavelength-tunable light source including a semiconductor laser.

Description of the Background Art

In recent times, a wavelength division multiplexing communication system that enables a large capacity transmission with one optical fiber by multiplexing a plurality of signal light beams having different wavelengths has been achieved with significant increase in the demand for communication.

A laser diode (LD) of a single mode (hereinafter referred to as a single-mode LD) in which a high side mode suppression ratio (SMSR) of at least greater than or equal to 30 to 40 dB is obtained is suitable for a light source used in the wavelength division multiplexing communication system. The single-mode LD includes, for example, a distributed feedback laser diode (hereinafter referred to as a DFB-LD) and a distributed Bragg reflector laser diode (hereinafter referred to as a DBR-LD).

To achieve the wavelength division multiplexing communication system, a low-cost wavelength-tunable light source that covers the entire wavelength band is necessary. An LD light source monolithically integrated on the same substrate has been receiving attention for the wavelength-tunable light source.

The wavelength-tunable light source is typically used in combination with an external modulator module that generates a data signal, and furthermore, monolithically integrating an electro-absorption (EA) optical modulator and a Mach-Zehnder (MZ) optical modulator on the same substrate is also researched.

Japanese Patent Application Laid-Open No. 2003-258368, for example, discloses a wavelength-tunable light source having been formed such that an output side of a plurality of DFB-LDs is connected to an input waveguide of a multimode interference optical multiplexing circuit (hereinafter referred to as an MMI), and the light multiplexed by the MMI is amplified by a semiconductor optical amplifier (hereinafter referred to as an SOA) and the amplified light is output from an output waveguide.

Japanese Patent Application Laid-Open No. 2007-65357, for example, discloses a wavelength-tunable light source in which an output side of a plurality of LDs is connected to an N×2-MMI (N is a natural number greater than or equal to three) and two output waveguides of the MMI are connected to two arms of the Mach-Zehnder modulator. According to Japanese Patent Application Laid-Open No. 2007-65357, an optical loss can be reduced compared to the case where an N×1-MMI is used.

Japanese Patent Application Laid-Open No. 2011-44581, for example, discloses a wavelength-tunable light source formed such that an output side of the plurality of DFB-LDs is connected to the MMI, and after a phase is adjusted at each of the two output waveguides of the MMT, the light is output from one output waveguide through the other MMI. According to Japanese Patent Application Laid-Open No. 2011-44581, higher output can be achieved and a signal-to-noise ratio (SN ratio) can be improved.

Japanese Patent Application Laid-Open No. 2003-215369, for example, discloses a configuration of a Mach-Zehnder interferometer including two arm waveguides, the configuration increasing a distance between the arm waveguides so that when only one of the arm waveguides is heated with a heater, the other arm waveguide is prevented from the influence of heat.

Japanese Patent Application Laid-Open No 2005-156855, for example, discloses a configuration of a Mach-Zehnder interferometer including two arm waveguides, the configuration increasing a distance between the arm waveguides so that when only one of the arm waveguides is heated with a heater, the other arm waveguide is prevented from the influence of heat, the configuration having a groove between the arm waveguides.

In a wavelength division multiplexing communication system in which the transmission speed is greater than or equal to 40 Gbps in a main line system, digital coherent communication using an optical phase modulation has been put into practice use in recent times. In the wavelength division multiplexing communication system adopting the digital coherent communication, a narrow-line-width wavelength-tunable light source having a laser oscillation line width of less than or equal to 1 MHz, more desirably less than or equal to 500 kHz, is used as a light source for transmission and reception.

In the wavelength division multiplexing communication adopting the digital coherent communication, separate wavelength-tunable light sources are needed for transmission and reception when the wavelengths of the light signals used for transmission and reception are different from each other, which increases power consumption of the entire transceiver including the wavelength-tunable light sources.

Meanwhile, in the wavelength division multiplexing communication adopting the digital coherent communication, the wavelengths of the light signals used for transmission and reception are often the same, and the narrow-line-width wavelength-tunable light source typically has different light output needed for transmission and reception. In such a case, one wavelength-tunable light source is desirably provided to be used as a light source for transmission and reception in terms of reducing the power consumption and a mounting area of the entire transceiver.

For example, in a case where the wavelength-tunable light source of each of Japanese Patent Application Laid-Open No. 2003-258368, Japanese Patent Application Laid-Open No. 2007-65357, and Japanese Patent Application Laid-Open No. 2011-44581 is used as the light source for transmission and reception, the wavelength-tunable light source of each of Japanese Patent Application Laid-Open No. 2003-258368, Japanese Patent Application Laid-Open No. 2007-65357, and Japanese Patent Application Laid-Open No. 2011-44581 has one output, which needs to be made to two outputs with a polarization maintaining coupler. However, a branch loss occurs in the polarization maintaining coupler in the configuration, and thus a drive current density of the SOA located on the output side of the wavelength-tunable light source needs to be increased to increase the light output from the wavelength-tunable light source in order to compensate for the branch loss. This may lead to the cause of increase in power consumption and a laser oscillation line width. The Mach-Zehnder interferometer of each of Japanese Patent Application Laid-Open No. 2003-215369 and Japanese Patent Application Laid-Open No. 2005-156855 heats only one of the arm waveguides with the heater to change a refractive index of the arm waveguide in order to control a phase, and the Mach-Zehnder interferometer positively adopts the action of heat. Thus, the heat is transmitted to the other arm portion, thereby possibly influencing the refractive index of the waveguide.

SUMMARY OF THE INVENTION

The present invention has been made in view of the above mentioned problems, and an object thereof is to provide a wavelength-tunable light source allowing for low power consumption and stable operations.

A wavelength-tunable light source according to the present invention includes: an optical coupling circuit that has an input portion connected to an output end of at least one input waveguide, has output portions connected to input ends of two output waveguides, and outputs light input from the at least one input waveguide to the two output waveguides; a semiconductor laser connected to an input end of the at least one input waveguide; a first optical amplifier and a second optical amplifier connected to corresponding output ends of the two output waveguides; and a first output portion and a second output portion respectively outputting the light passing through the first optical amplifier and the second optical amplifier. A first arm portion and a second arm portion have an arrangement distance therebetween greater than a distance between the input ends of the two output waveguides and greater than a distance between an output end of the first output portion and an output end of the second output portion, the first arm portion forming a traveling path of light from one of the two output waveguides to the first output portion through the first optical amplifier, the second arm portion forming a traveling path of light from another one of the two output waveguides to the second output portion through the second optical amplifier. The first optical amplifier and the second optical amplifier have curved portions in which the first output portion and the second output portion are curved in a direction toward each other, and the first optical amplifier and the second optical amplifier respectively output light from the output end of the first output portion and the output end of the second output portion.

The wavelength-tunable light source according to the present invention suppresses the thermal cross-talk between the optical amplifiers, allowing for low power consumption and stable operations.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a diagram for describing a configuration that controls a temperature of the wavelength-tunable light source;

FIGS. 9 and 10 are plan views for describing a technique for controlling the wavelength-tunable light source in the second preferred embodiment of the present invention;

FIG. 14 is a plan view showing a configuration of a wavelength-tunable light source in a fourth preferred embodiment of the present invention;

FIG. 15 is a cross-sectional view showing the configuration of the wavelength-tunable light source in the fourth preferred embodiment of the present invention;

FIG. 18 is a plan view showing a configuration of a wavelength-tunable light source in a second modification of the fourth preferred embodiment of the present invention;

FIG. 19 is a cross-sectional view showing the configuration of the wavelength-tunable light source in the second modification of the fourth preferred embodiment of the present invention;

DESCRIPTION OF THE PREFERRED EMBODIMENTS

Preferred embodiments of the present invention will be described below with reference to the drawings. Hereinafter, the same or similar components in each figure are denoted by the same references or the same names, and their functions are also similar. Accordingly, their redundant description will be omitted.

Dimensions, materials, shapes, and relative positions of respective components shown as examples in each preferred embodiment may be appropriately changed according to a configuration and various conditions of a device to which the present invention is applied, and the present invention is not restricted to the examples.

<Underlying Technology>

Figure 26:
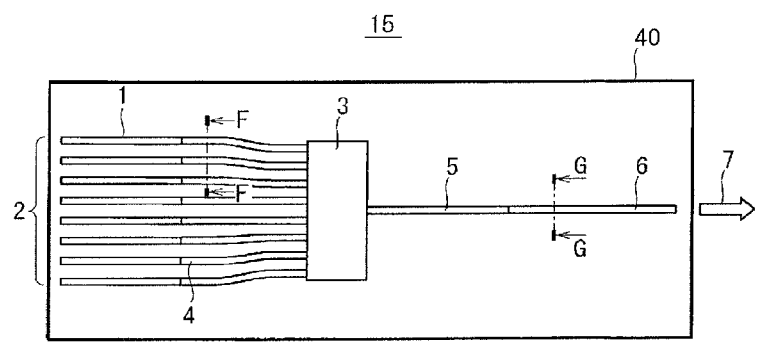
FIG. 26 is a plan view showing a configuration of a wavelength-tunable light source in an underlying technology of the present invention.

First, an underlying technology of the present invention is described with reference to FIGS. 26 to 30. FIG. 26 is a plan view showing au example of a configuration of a wavelength-tunable light source 15 in the underlying technology. FIG. 26 shows the configuration of the wavelength-tunable light source including a plurality of single-mode LDs having different oscillation wavelengths.

In the wavelength-tunable light source 15 in the underlying technology as shown in FIG. 26, a DFB-LD array 2 formed of an integration of N (N is a natural number greater than or equal to two) DFB-LDs 1 is connected to MMI input waveguides 4 of an N×1-MMI 3 (N is a natural number greater than or equal to three) having N inputs and one output. In other words, the N DFB-LDs 1 are connected to the corresponding N MMI input waveguides 4, and the light multiplexed by the N×1-MMI 3 is output as a transmission light output 7 to the outside through an SOA 6 connected to an MMI output waveguide 5.

In the configuration described above, when a freely-selected DFB-LD 1 of the DFB-LD array 2 laser-oscillates, 1/N of an output of light (hereinafter referred to as LD output light) output from the one DFB-LD 1 is coupled to the MMI output waveguide 5, and the remaining output of (N−1)/N is emitted to the outside of the MMI output waveguide 5. A branch loss, a coupling loss, and the like are compensated by injecting current into the SOA 6 from which a high transmission light output 7 is output.

Figure 27:
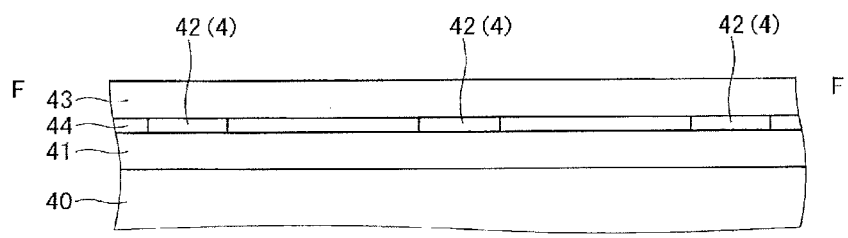
FIG. 27 is a cross-sectional view showing a configuration of MMI input waveguides in the wavelength-tunable light source in the underlying technology of the present invention.

FIG. 27 is a cross-sectional view taken along an F-F line of FIG. 26. FIG. 27 shows an example of a configuration of the MMI input waveguides 4. As shown in FIG. 27, an InGaAsP waveguide layer 42 functions as the MMI input waveguides 4, the InGaAsP waveguide layer 42 containing indium (In), gallium (Ga), arsenic (As), and phosphorus (P) and being selectively formed on an InP lower clad layer 41 in a laminated film (semiconductor laminated film). The laminated film includes the InP lower clad layer 41, an InP current block layer 44, and an InP upper clad layer 43 laminated in the stated order and is located on an InP substrate 40 that contains In and P and is a semiconductor substrate.

An InGaAsP-based material that does not absorb the LD output light is used for the InGaAsP waveguide layer 42. The InGaAsP waveguide layer 42 may be a bulk epitaxial layer or a multiple quantum well (MQW) layer.

FIG. 27 shows the cross-sectional configuration of the MMI input waveguides 4. The MMI output waveguide 5 has the same cross-sectional configuration as that of the MMI input waveguides 4, and the InGaAsP waveguide layer 42 functions as the MMI output waveguide 5. In this case, the InGaAsP waveguide layer 42 comprises only one thereof.

The N×1-MMI 3 has a great length in the alignment direction of the MMI input waveguides 4 such that the N MMI input waveguides 4 can be connected to the N×1-MMI 3, and this wide portion is a multimode region. The multimode region is made of InGaAsP, which is the same as the InGaAsP waveguide layer 42 shown in FIG. 27, and the multimode region has such a length that the width (length in the horizontal direction to the paper plane of FIG. 27) of the InGaAsP waveguide layer 42 is increased as described above. The multimode region is surely surrounded by the InP lower clad layer 41, the InP current block layer 44, and the InP upper clad layer 43.

Figure 28:
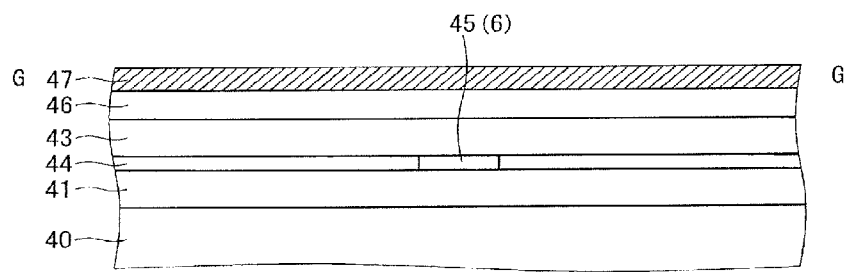
FIG. 28 is a cross-sectional view showing a configuration of an SOA in the wavelength-tunable light source in the underlying technology of the present invention.

FIG. 28 is a cross-sectional view taken along a G-G line of FIG. 26. FIG. 28 shows an example of a configuration of the SOA 6. As shown in FIG. 28, an InGaAsP active layer 45 selectively formed on the InP lower clad layer 41 in a laminated film (semiconductor laminated film) functions the SOA 6. The laminated film includes the InP lower clad layer 41, the InP current block layer 44, the InP upper clad layer 43, an InGaAsP contact layer 46, and an electrode 47 laminated in the stated order and is located on the InP substrate 40.

An InGaAsP-based material that has a gain with respect to light passing through the MMI output waveguide 5 (hereinafter referred to as waveguide light) is used for the InGaAsP active layer 45. The InGaAsP active layer 45 may be a bulk epitaxial layer or an MQW layer.

FIG. 28 shows the cross-sectional configuration of the SOA 6, and the DFB-LDs 1 have the same cross-sectional configuration as that of the SOA 6. It should be noted that the electrode 47 is separated between the DFB-LDs 1 adjacent to each other and current is independently injected into each of the DFB-LDs 1. When the current is injected into the DFB-LDs 1 and the SOA 6 through the electrode 47 located on the InGaAsP contact layer 46, a gain is generated in the InGaAsP active layer 45 and spontaneous emission light is generated. In the DFB-LDs 1, spontaneous emission light having a specific wavelength reflected by a diffraction grating becomes seed light of stimulated emission, and a laser oscillation occurs when a current exceeds a predetermined threshold current. On the other hand, the SOA 6 functions as an amplifier for the LD output light, but the SOA 6 is designed not to laser-oscillate alone.

An oscillation wavelength of the DFB-LD 1 changes according to a temperature of the DFB-LD 1 (hereinafter referred to as an element temperature) at a rate of approximately 0.1 nm/° C. Thus, an interval of an oscillation wavelength of each of the DFB-LDs 1 needs to be designed such that an oscillation wavelength of a freely-selected DFB-LD 1 of the DFB-LD array 2 (for example, N=10 to 16) coincides with an oscillation wavelength of another DFB-LD 1 adjacent to the freely-selected DFB-LD 1 when the element temperature is changed in a predetermined range (for example, 10 to 50° C.). In this case, the entire wavelength band (approximately 30 to 40 nm) of a conventional band (C band) or a long band (L band) can be covered with the DFB-LD array 2 formed into one chip by selecting the DFB-LDs 1 and adjusting the element temperature.

Figure 29:
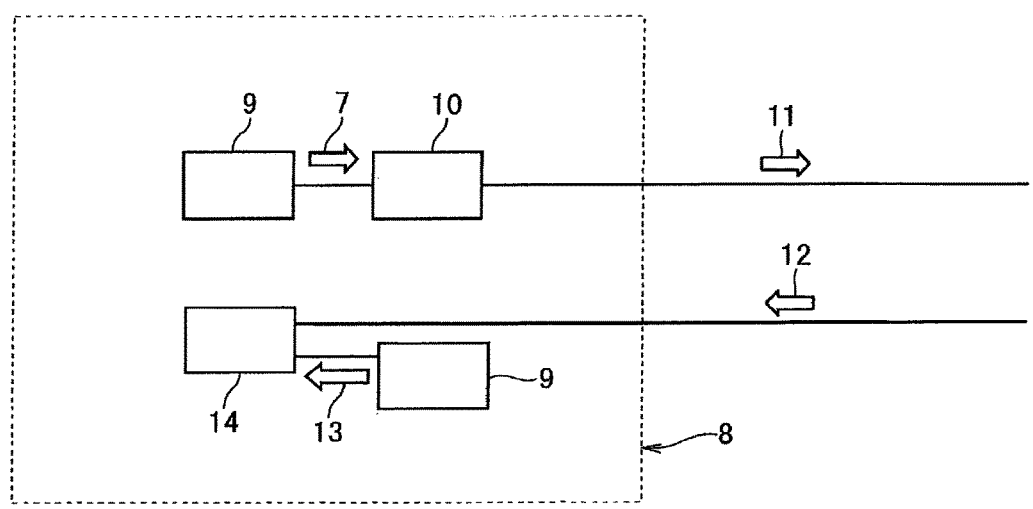
FIG. 29 shows a configuration of a transceiver in the underlying technology of the present invention.

FIG. 29 is a block diagram showing an example of a configuration of a transceiver 8 including the wavelength-tunable light source 15 in the underlying technology described above. FIG. 29 shows the configuration of the transceiver 8 for a digital coherent communication system.

The transmission light output 7 output from a wavelength-tunable light source module 9 (including the wavelength-tunable light source 15) is modulated by a modulator module 10 and is subsequently output as a transmission signal 11 to the outside.

A reception signal 12 is input from the outside to a reception module 14 together with a reception light output 13 output from the wavelength-tunable light source module 9 and is reconstructed after signal processing.

An insertion loss occurs in the modulator module 10 in the transceiver 8 shown in FIG. 29, and thus the transmission light output 7 typically needs to be a high output while the reception light output 13 may be a relatively low output.

As described above, however, in the case where wavelengths of light signals for transmission and reception are the same, one wavelength-tunable light source module is desirably provided to be used as a light source for transmission and reception in terms of reducing the power consumption and the mounting area of the entire transceiver 8.

Figure 30:
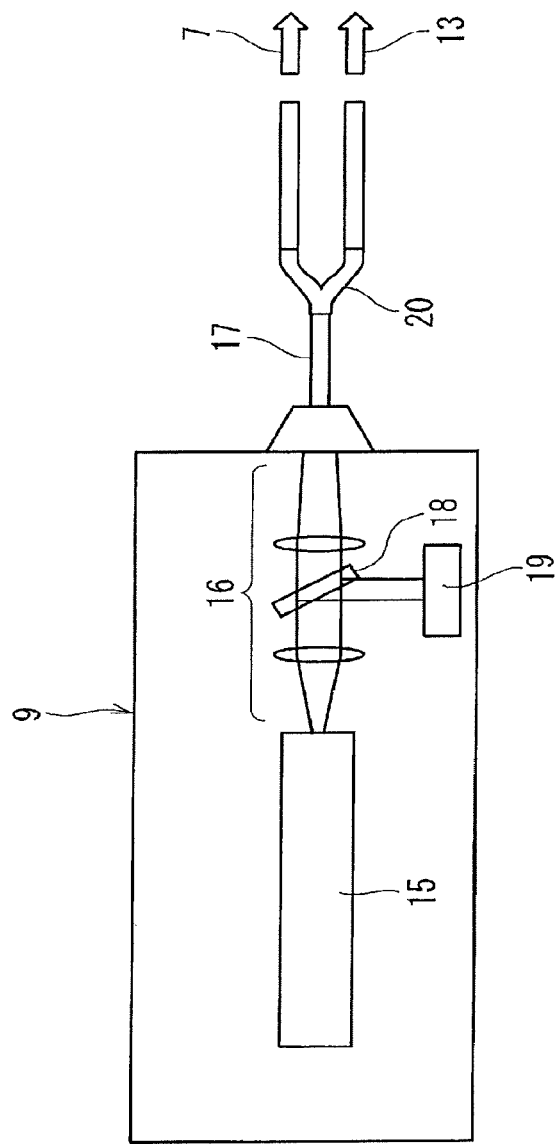
FIG. 30 shows a configuration of a wavelength-tunable light source module in the underlying technology of the present invention.

FIG. 30 is a block diagram showing an example of a configuration of the wavelength-tunable light source module 9 including the wavelength-tunable light source in the underlying technology. FIG. 30 shows the configuration in which wavelengths of light signals used for transmission and reception are the same and one wavelength-tunable light source module is used as a light source for transmission and reception.

The wavelength-tunable light source module includes the wavelength-tunable light source 15, a coupling optical system 16, a beam splitter 18 installed in the coupling optical system 16, and a monitor 19 monitoring light split by the beam splitter 18. An LD output side of the wavelength-tunable light source module 9 is connected to an optical fiber 17 and a polarization maintaining coupler 20.

The wavelength-tunable light source 15 emits the single-mode LD output light, and the emitted LD output light is coupled to the optical fiber 17 through the coupling optical system 16 including lenses and an optical isolator (not shown). The LD output light coupled to the optical fiber 17 is branched at a predetermined ratio by the polarization maintaining coupler 20, and each of the branched LD output light is output as the transmission light output 7 and the reception light output 13.

Part of the LD output light passing through the coupling optical system 16 is separated by the beam splitter 18, and a wavelength and an output level of the LD output light are detected by the monitor 19 including a wavelength filter and a photodiode (not shown).

In the configuration described above, the wavelength-tunable light source 15 has one output, which is thus made to two outputs with the polarization maintaining coupler. In this configuration, however, a branch loss occurs in the polarization maintaining coupler, so that a drive current density of the SOA (not shown) located on the output side of the wavelength-tunable light source needs to be increased to increase the LD output light from the wavelength-tunable light source 15 in order to compensate for the branch loss. This may lead to the cause of increase in the power consumption and the laser oscillation line width. Further, the polarization maintaining coupler is used, which increases the mounting area.

First Preferred Embodiment

Configuration of Device

Figure 1:
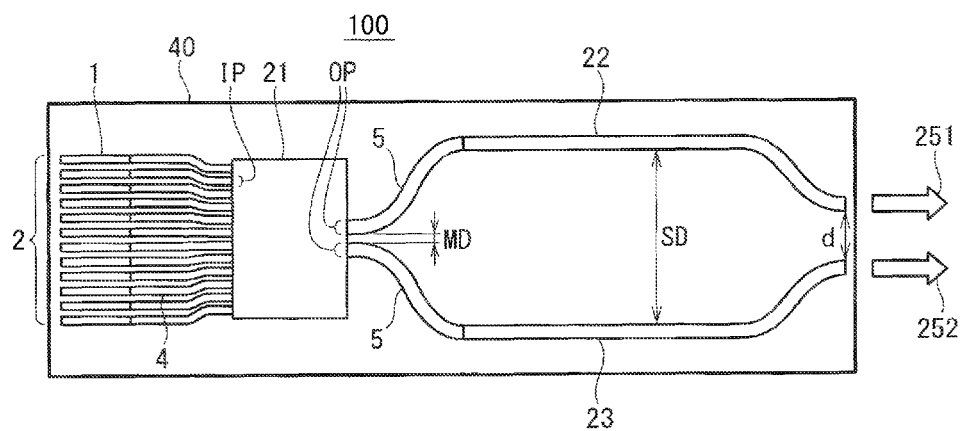
FIG. 1 is a plan view showing a configuration of a wavelength-tunable light source in a first preferred embodiment of the present invention.

FIG. 1 is a plan view showing an example of a configuration of a wavelength-tunable light source 100 in a first preferred embodiment of the present invention. In the wavelength-tunable light source 100 as shown in FIG. 1, a DFB-LD array 2 formed of an integration of 12 DFB-LDs 1 (semiconductor lasers) is connected to MMI input waveguides 4 of a 12×2-MMI 21 (optical coupling circuit) having 12 inputs and two outputs. In other words, the 12 DFB-LDs 1 are connected to corresponding input ends of the 12 MMI input waveguides 4. Each of the 12 DFB-LDs 1 having a different wavelength can oscillate in a single mode.

The 12×2-MMI 21 has 12 input portions IP and two output portions OP. The 12 input portions IP are connected to corresponding output ends of the 12 MMI input waveguides 4, and the two output portions OP are connected to corresponding input ends of two MMI output waveguides 5. The LD output light input from each of the MMI input waveguides 4 is multiplexed, and the multiplexed LD output light is output to each of the MMI output waveguides 5.

Output ends of the two MMI output waveguides 5 are connected to corresponding input ends of an SOA 22 and an SOA 23 (optical amplifiers) of the same waveguide type. A light output 251 (first light output) and a light output 252 (second light output) are respectively output from an output end of the SOA 22 and an output end of the SOA 23 to the outside. A current can be individually applied to the SOA 22 and the SOA 23, which will be described below.

Herein, the output end of the SOA 22 and the output end of the SOA 23 may be respectively referred to as an output end of a first output portion and an output end of a second output portion of the wavelength-tunable light source 100. Traveling paths of light from the input ends of the two MMI output waveguides 5 to the output ends of the first output portion and the second output portion may be each referred to as a first arm portion and a second arm portion.

The two MMI output waveguides 5 are provided in such a shape that the MMI output waveguides 5 extend in a direction far from each other and that a distance between the output ends thereof is greater than a distance between the input ends thereof connected to the two output portions OP of the 12×2-MMI 21. The output ends of the two MMI output waveguides 5 are connected to the corresponding input ends of the SOAs 22 and 23, so that a distance SD (arrangement distance) between the SOAs is greater than a distance MD between the input ends of the two MMI output waveguides 5. In other words, the first and second arm portions have a distance therebetween greater than the distance MD between the input ends of the two MMI output waveguides 5. FIG. 1 shows that the distance MD between the input ends of the two MMI output waveguides 5 is a distance between the edges of the inside of the MMI output waveguides 5, but it may be a distance between the edges of the outside of the MMI output waveguides 5 or a distance between the center thereof. This also applies to the distance SD between the SOAs. Moreover, FIG. 1 shows that a distance d between the output ends of the SOAs 22 and 23 is a distance between the edges of the inside of the SOAs 22 and 23, but it may be a distance between the edges of the outside of the SOAs 22 and 23 or a distance between the center of the SOA 22 and the center of the SOA 23.

The SOAs 22 and 23 have linear portions keeping the distance SD and curved portions in which the first and second output portions are curved in a direction toward each other. The shape of the curved portions is not restrictive as long as the first and second output portions are curved in the direction toward each other.

The SOAs 22 and 23 may have different lengths from each other by, for example, changing a position of the input end of the SOA 22 to shorten the length of the SOA. In this manner, the SOAs 22 and 23 are provided in a shape having the curved portions in which the first and second output portions are curved in the direction toward each other, so that the distance d between the output ends of the SOAs 22 and 23 can be shorter than the distance SD between the SOAs 22 and 23.

This configuration allows to reduce the distance d between the output ends of the SOAs 22 and 23 even if the distance between the SOAs is increased, which can lead to an excellent coupling efficiency of light to the lenses. This will be described below.

Figure 2:
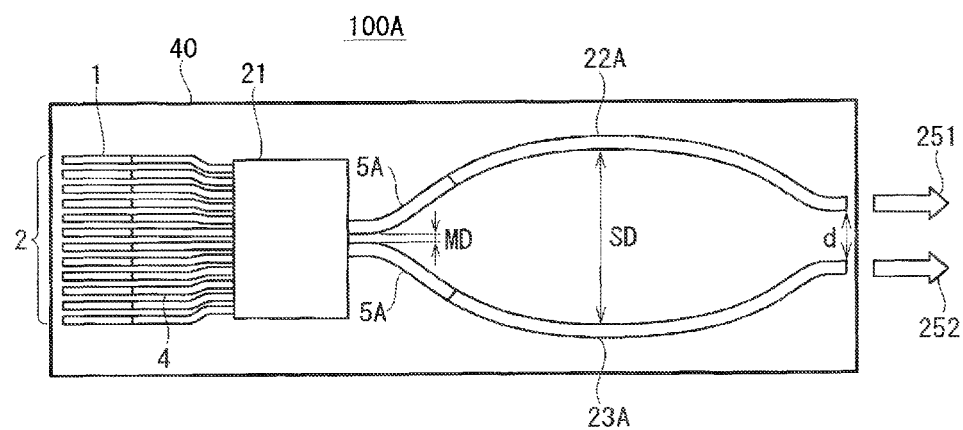
FIG. 2 is a plan view showing another configuration of the wavelength-tunable light source in the first preferred embodiment of the present invention.

The SOAs may have curved shapes without having the linear portions similarly to an SOA 22A and an SOA 23A of a wavelength-tunable light source 100A shown in FIG. 2, and MMI output waveguides 5A may also have the corresponding curved shapes. In this case, the SOAs 22A and 23A having the curved shapes are disposed such that a peak of each curved line faces outwardly, and a peak distance is defined as a distance SD between the SOAs. FIG. 2 shows that the distance SD between the SOAs is a distance between the edges of the inside of the SOA 22A and the SOA 23A, but it may be a distance between the edges of the outside of the SOA 22A and the SOA 23A or a distance between the center of the SOA 22A and the center of the SOA 23A.

Next, a method for forming the SOA 22 and the SOA 23 is described. First, the two MMI output waveguides 5 are formed so as to reach an end edge portion of the light output side of the InP substrate 40. At this point, the portions in which the SOAs 22 and 23 are formed are also the MMI output waveguides 5.

Subsequently, predetermined portions of the MMI output waveguides 5, namely, the portions in which the SOAs 22 and 23 are formed, are removed by etching so as to reach the InP substrate 40. Then, the InP lower clad layer 41, the InP current block layer 44, the InGaAsP active layer 45, the InP upper clad layer 43, and the InGaAsP contact layer 46 are formed by a regrowth technique called butt joint growth, and the sections of the MMI output waveguides 5 (namely, the section of the InGaAsP waveguide layer 42) are directly bonded to the sections of the SOA 22 and the SOA 23 (namely, the section of the InGaAsP active layer 45). After that, the electrode 47 is formed on the InGaAsP contact layer 46. Herein, the butt joint growth is a technique for forming a configuration called a butt joint in which different layers such as a waveguide layer and an active layer are bonded to each other.

To suppress occurrence of light that is reflected back at the output ends of the SOA 22 and the SOA 23, output end faces of the SOA 22 and the SOA 23 are applied with nonreflective coating (not shown). Suppressing the occurrence of light that is reflected back can suppress an increase in laser oscillation line width.

The MMI input waveguides 4 and the MMI output waveguides 5 have the same configurations as those shown in FIG. 27, and the DFB-LDs 1, the SOA 22, and the SOA 23 have the same configurations as those shown in FIG. 28, so that their redundant description will be omitted.

<Operations>

Next, operations of the wavelength-tunable light source 100 are described. When one DFB-LD 1 is freely selected and is injected with a current greater than or equal to a threshold current, a laser oscillation occurs in the selected DFB-LD 1. The LD output light output from the DFB-LD 1 is input to the multimode region of the 12×2-MMI 21 through the MMI input waveguide 4.

If the 12×2-MMI 21 is appropriately designed, 1/12 of the LD output light output from the DFB-LD 1 is coupled to each of the two MMI output waveguides 5 across the entire wavelength band. When a plurality of DFB-LDs 1 are selected and are each injected with the current greater than or equal to the threshold current, a laser oscillation occurs in each of the selected DFB-LDs 1, and the LD output light output from each of the DFB-LDs 1 is input to the multimode region of the 12×2-MMI 21 through the MMI input waveguides 4. The LD output light is then multiplexed, and the multiplexed LD output light is output to the MMI output waveguides 5. In this case, when N DFB-LDs 1 are selected, N/12 of the LD output light is coupled to each of the two MMI output waveguides 5.

Therefore, even if the two MMI output waveguides 5 are provided, the drive current density does not need to be increased more than that of the DFB-LDs 1 in the underlying technology. In other words, the drive current density of the DFB-LDs 1 is approximately the same as that in the underlying technology.

Injecting current into the SOA 22 and the SOA 23 amplifies the LD output light traveling through each of the MMI output waveguides 5, and increasing a current value also increases each amplification factor of the SOA 22 and the SOA 23. The amplification factor is expressed by logarithmically displaying intensity of the output light having the input light as a reference, but the amplification factor typically shows nonlinearity. In other words, the amplification factor is substantially constant when the input light is weak (low output), but the amplification factor decreases when the input light is intense (high output), so that the maximum output shows a tendency to become saturated with increase in the intensity of the input light.

The saturation output per unit length of each SOAs 22 and 23 is determined by an optical confinement factor and a current density of the active layer (corresponding to the InGaAsP active layer 45 in FIG. 28) of each SOAs 22 and 23. Therefore, when the active layers of the SOAs 22 and 23 have the same optical confinement factor and current density, the maximum outputs of the SOAs 22 and 23 are determined by the lengths of the SOAs 22 and 23.

The light output 251 and the light output 252 respectively output from the output end of the SOA 22 and the output end of the SOA 23 are coupled to a 2-conductor fiber (not shown) through a lens system (not shown), and the distance d between the output ends of the SOAs 22 and 23 needs to be a close distance of several tens of μm as shown in FIG. 1. In other words, the lens forming the lens system mentioned above has a spherical aberration, and light passing through the center of the lens and light passing through a location far from the center are slightly different in focal location from each other, thereby reducing the coupling efficiency due to the spherical aberration. Thus, the distance d between the output ends of the SOAs 22 and 23 is set to be a close distance of several tens of μm. When the coupling efficiency is poor, a drive current density of the LD or the SOA needs to be increased to obtain desired light output, which increases power consumption.

Accordingly, the SOA 22 and the SOA 23 have the curved portions as shown in FIG. 1, and the output portions thereof are curved in the direction toward each other. The two MMI output waveguides 5 are provided in the shape such that the MMI output waveguides 5 extend in the direction far from each other and that the distance between the output ends thereof is greater than the distance between the input ends thereof connected to the two output portions OP of the 12×2-MMI 21. Thus, the distance SD between the SOAs is greater than the distance MD between the input ends of the two MMI output waveguides 5 and greater than the distance d between the output ends of the SOAs 22 and 23, so that the excellent coupling efficiency can be obtained, and thermal cross-talk between the SOAs can be suppressed.

For example, in a Mach-Zehnder interferometer, a distance of a pair of arm portions having a relatively great distance therebetween is reduced to several μm with curved waveguides, and light is multiplexed by the MMI or the like and is output. The distance d between the output ends is several tens of μm in the present invention while a distance d between output ends is close to several μm in the Mach-Zehnder interferometer because the MMI or the like interferes with the light. Moreover, a heater controls a phase of the light passing through the arm portions to turn the light output ON and OFF by the effect of interference of light in the Mach-Zehnder interferometer while the present invention does not interfere with light and directly uses light such as the light outputs 251, 252 output from each arm portion. Thus, the present invention is different from the Mach-Zehnder interferometer.

The Mach-Zehnder interferometer heats one of the arm portions with the heater to change a refractive index of the light in order to control the phase, and the Mach-Zehnder interferometer positively adopts the action of heat, so that the heat is transmitted to the other arm portion and the characteristics are thus influenced. The present invention focuses on the possibility that the heat generated when a current is applied to one of the SOAs to amplify the light interferes with the other SOA of the adjacent arm portion, so that the present invention has the configuration capable of reducing the heat interference.

In other words, when the distance SD between the SOAs is about the same as the distance d between the output ends, the distance SD between the SOAs is relatively short, which causes the thermal cross-talk between the SOAs. The amplification factors of the SOAs have temperature dependence, and the amplification factors decrease with increase in temperature.

When light is needed for both transmission and reception in the wavelength division multiplexing communication system, a current needs to be applied to both of the SOAs 22 and 23, but the thermal cross-talk at this time may reduce the light output for both of the transmission and the reception. At the occurrence of the thermal cross-talk, the drive current density of the LD or the SOA is increased to suppress a decrease in the light output, which increases power consumption.

However, similarly to this preferred embodiment, the configuration in which the distance SD between the SOAs 22 and 23 is greater than the distance MD between the input ends of the two MMI output waveguides 5 and greater than the distance d between the output ends of the SOAs 22 and 23 can relatively increase the distance SD between the SOAs and suppress the thermal cross-talk between the SOAs, allowing for low power consumption.

Figure 4:
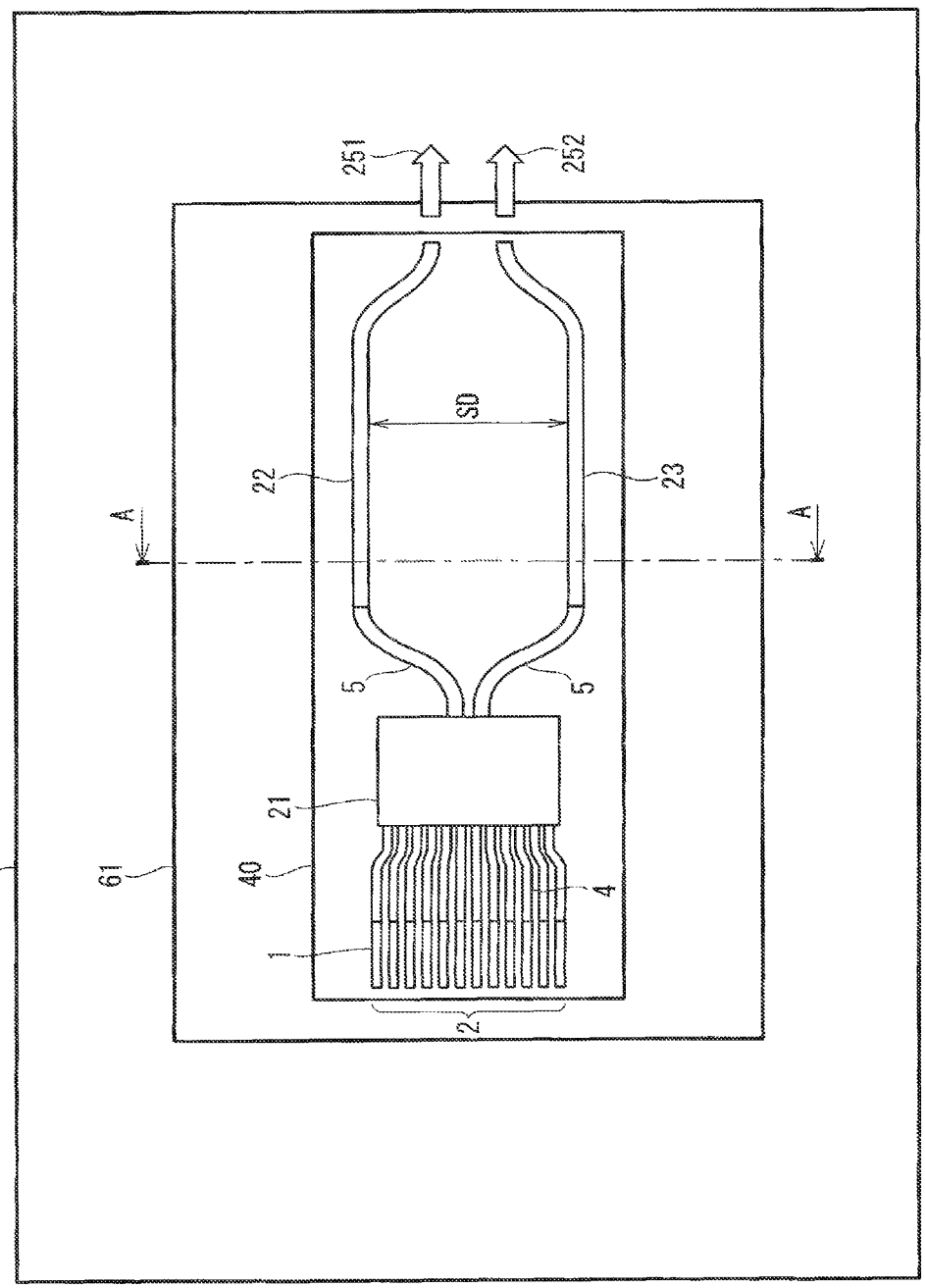
FIG. 4 is a plan view showing a configuration in which the wavelength-tunable light source of the first preferred embodiment is mounted on a Peltier element.

To maintain the temperature of the wavelength-tunable light source constant, the temperature is normally controlled with a Peltier element. In other words, as shown in FIG. 3, the temperature is controlled by the configuration that, includes the wavelength-tunable light source 100 mounted on a heat conductor 61 such as a metal plate and a submount and that includes, a Peltier element 62 mounted on the heat conductor 61. FIG. 4 is a plan view showing a configuration in which the wavelength-tunable light source 100 is mounted or the Peltier element 62 when seen from the wavelength-tunable light source 100 side. In addition, FIG. 3 corresponds to the cross-sectional view taken along an A-A line of FIG. 4.

As described above, controlling temperature from the lower side of the InP substrate 40 makes the temperature of the lower surface of the InP substrate 40 almost constant. However, for example, the heat generated from the SOA 23 and transmitted in the horizontal direction of the InP substrate 40 reaches the SOA 22, which causes the thermal cross-talk. On the other hand, the heat transmitted in the vertical direction reaches the lower surface of the InP substrate 40, and the heat is absorbed by controlling the temperature.

Therefore, for the heat transmitted in the horizontal direction of the InP substrate 40, the thermal cross-talk is reduced as the distance SD between the SOAs is greater, and for the heat transmitted in the vertical direction of the InP substrate 40, the effect of absorbing heat by controlling the temperature is enhanced and the thermal cross-talk is reduced as a substrate thickness h is thinner.

In a case where a relationship between the distance SD between the SOAs and the substrate thickness h is SD=h, an amount of heat that is generated from the SOA 23, is transmitted in the horizontal direction of the InP substrate 40, and reaches the SOA 22 is at the same level as that of an amount of heat that is generated from the SOA 23, is transmitted in the vertical direction of the InP substrate 40, and reaches the lower surface of the substrate.

Herein, on the condition that SD=h, the thermal cross-talk is suppressed as the effect of absorbing heat by controlling the temperature is enhanced, so that the configuration is preferably formed so as to satisfy the condition that SD>h. For example, for the substrate thickness h of 100 pin, the distance SD between the SOAs preferably exceeds 100 μm.

As described above, the wavelength-tunable light source 100 in this first preferred embodiment can suppress the thermal cross-talk between the SOAs, allowing for low power consumption.

Second Preferred Embodiment

The wavelength-tunable light source 100 in the first preferred embodiment described above has the configuration in which the distance SD between the SOAs is greater than the distance MD between the input ends of the two MMI output waveguides 5 and greater than the distance d between the output ends of the SOAs 22 and 23, to thereby suppress the thermal cross-talk between the SOAs. A wavelength-tunable light source 200 in a second preferred embodiment includes SOAs having a multistage configuration and reduces drive current densities of the SOAs including output portions, to thereby further suppress the thermal cross-talk.

<Configuration of Device>

Figure 5:
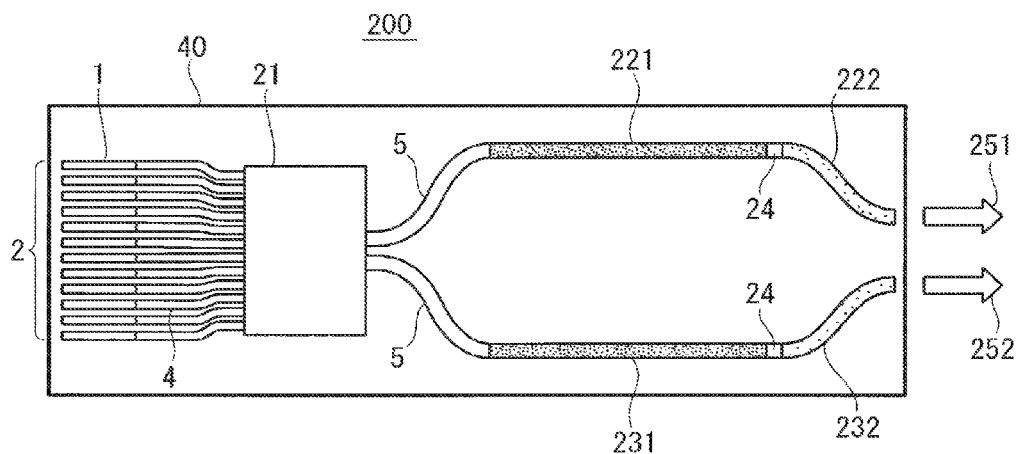
FIG. 5 is a plan view showing a configuration of a wavelength-tunable light source in a second preferred embodiment of the present invention.

FIG. 5 is a plan view showing an example of a configuration of the wavelength-tunable light source 200 in the second preferred embodiment of the present invention. The wavelength-tunable light source 200 is different from the wavelength-tunable light source 100 in the first preferred embodiment in that the wavelength-tunable light source 200 includes two-stage SOAs.

The output ends of the two MMI output waveguides 5 are connected to corresponding input ends of an SOA 221 and an SOA 231 of the same waveguide type. The SOA 221 and the SOA 231 are respectively connected in series to an SOA 222 and an SOA 232 through SOA connecting waveguides 24. The light output 251 and the light output 252 are respectively output from an output end of the SOA 222 and an output end of the SOA 232 to the outside.

Herein, the output ends of the SOAs 222 and 232 may be respectively referred to as an output end of a first output portion and an output end of a second output portion of the wavelength-tunable light source 200. Traveling paths of light from the input ends of the two MMI output waveguides 5 to the output ends of the first output portion and the second output portion may be each referred to as a first arm portion and a second arm portion.

The SOAs 221, 222, 231, and 232 include the electrodes 47 of FIG. 28 that are electrically separated from each other and can be individually controlled by current. In other words, the SOA 221 and the SOA 222 have the same cross-sectional structure, but the SOA connecting waveguide 24 in the boundary between the SOAs 221 and 222 does not include an electrode. Thus, each of the electrodes of the SOAs 221 and 222 are electrically separated from each other and can be individually controlled by current. Similarly, the SOA connecting waveguide 24 in the boundary between the SOAs 231 and 232 does not include an electrode, and each of the electrodes of the SOAs 231 and 232 are electrically separated from each other and can be individually controlled by current. In addition, the SOA connecting waveguides 24 have a length of about several um.

The SOA connecting waveguides 24 may have the same configuration (see FIG. 28) as that of the LD or the SOA from which the electrode 47 is omitted, or may have the same configuration (see FIG. 27) as that of the MMI input waveguide 4 or the MMI output waveguide 5. The former configuration is preferable to suppress light that is reflected back from connecting portions. In a case where a current is not injected into the SOA connecting waveguides 24 having the former configuration, a transmission loss of several dB or more occurs when the SOA connecting waveguides 24 have a length of several hundreds of urn. When the SOA connecting waveguides 24 have a length of about several μm as described above, the transmission loss hardly occurs and the SOA connecting waveguides 24 can be used without problems.

For the SOA connecting waveguides 24 having the configuration in FIG. 27, predetermined portions of the MMI output waveguide 5, namely, portions in which the SOAs 221, 222, 231, and 232 are formed except for portions in which the SOA connecting waveguides 24 are formed, are removed by etching so as to reach the InP substrate 40. Subsequently, the InP lower clad layer 41, the InP current block layer 44, the InGaAsP active layer 45, the InP upper clad layer 43, and the InGaAsP contact layer 46 are formed by butt joint growth. The sections of the MMI output waveguides 5 (namely, the section of the InGaAsP waveguide layer 42) are directly bonded to the sections of the SOAs 221, 222, 231, and 232 (namely, the section of the InGaAsP active layer 45).

In this manner, the MMI output waveguides 5 and the SOAs 221 and 231 are butt-joined, the SOAs 221 and 231 and the SOA connecting waveguides 24 are butt-joined, and the SOAs 222 and 232 and the SOA connecting waveguides 24 are butt-joined.

For the SOA connecting waveguides 24 having the configuration in FIG. 28 from which the electrode is omitted, predetermined portions of the MMI output waveguide 5, namely, portions in which the SOAs 221, 222, 231, and 232 are formed except for portions in which the SOA connecting waveguides 24 are formed, are removed by etching so as to reach the InP substrate 40. Subsequently, the InP lower clad layer 41, the InP current block layer 44, the InGaAsP active layer 45, the InP upper clad layer 43, and the InGaAsP contact layer 46 are formed by butt joint growth. The sections of the MMI output waveguides 5 (namely, the section of the InGaAsP waveguide layer 42) are directly bonded to the sections of the SOAs 221, 222, 231, and 232 (namely, the section of the InGaAsP active layer 45). After that, when the electrode 47 is formed on the InGaAsP contact layer 46, the electrode 47 is prevented from being formed on the upper portions of the SOA connecting waveguides 24.

To suppress occurrence of light that is reflected back at the output ends of the SOA 222 and the SOA 232, output end faces of the SOA 222 and the SOA 232 are applied with nonreflective coating (not shown). Suppressing the occurrence of light that is reflected back can suppress an increase in laser oscillation line width.

The MMI input waveguides 4 and the MMI output waveguides 5 have the same configurations as those shown in FIG. 27, and the DFB-LDs 1, the SOAs 221, 222, 231, and 232 have the same configurations as those shown in FIG. 28, so that their redundant description will be omitted.

<Operations>

Next, operations of the wavelength-tunable light source 200 are described. When a current is injected into the SOAs 221 and 222, the LD output light traveling through the MMI output waveguide 5 is amplified by the SOA 221 first, and the light amplified by the SOA 221 is further amplified by the SOA 222, which is the subsequent stage, and is output as the light output 251.

When a current is injected into the SOAs 231 and 232, the LD output light traveling through the MMI output waveguide 5 is amplified by the SOA 231 first, and the light amplified by the SOA 231 is further amplified by the SOA 232, which is the subsequent stage, and is output as the light output 252.

Herein, if the density of the drive current applied to each of the SOAs is the same as the current densities of the SOAs in the first preferred embodiment, the thermal cross-talk occurs between the SOAs at the output ends of the SOAs 222 and 232, possibly increasing power consumption.

Thus, the wavelength-tunable light source 200 is controlled to reduce the drive current densities of the SOAs 222 and 232 lower than the drive current densities of the SOAs 221 and 231, so that the thermal cross-talk at the output ends is suppressed, and the increase in the power consumption can be suppressed. In FIG. 5, the SOAs having the high drive current densities have the dark hatching pattern, and the SOAs having the low drive current densities have the light hatching pattern.

The example of reducing the current densities of both of the SOAs 222 and 232 is described above, but only an SOA including an output portion of one of the arm portions, for example, only the SOA 222, may have the reduced current density. Such control makes the light output 251 lower than the light output 252, which causes no problem if the light output 251 is used for reception and the light output 252 is used for transmission.

First Modification

Figure 6:
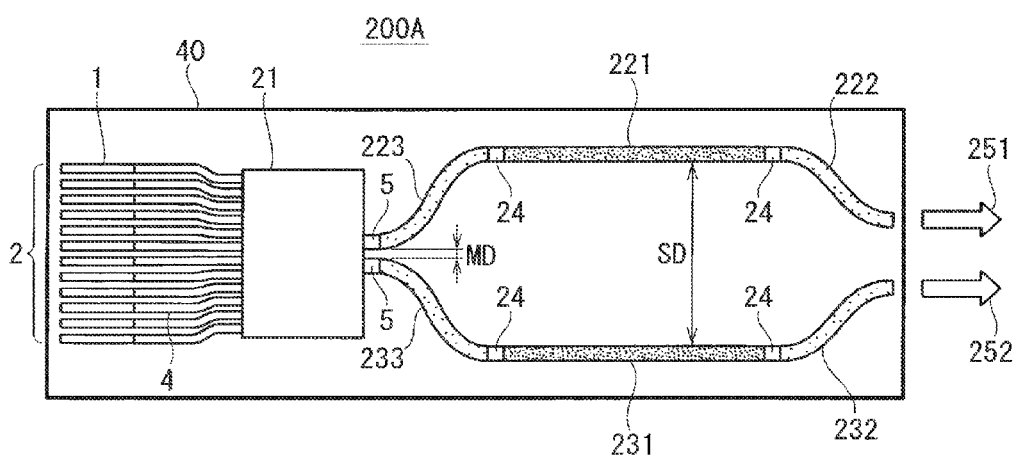
FIGS. 6 and 7 are plan views showing a configuration of a wavelength-tunable light source in a first modification of the second preferred embodiment of the present invention.

A number of stages of the SOAs is not limited to two and may be t similarly to a wavelength-tunable light source 200A shown in FIG. 6.

In other words, the output ends of the two MMI output waveguides 5 are connected to corresponding input ends of an SOA 223 and an SOA 233 of the same waveguide type that are first-stage optical amplifiers. The SOA 223 and the SOA 233 are respectively connected in series to the SOA 221 and the SOA 231 through the SOA connecting waveguides 24. Further, the SOA 221 and the SOA 231 are respectively connected to the SOA 222 and the SOA 232 through the SOA connecting waveguides 24. The light output 251 and the light output 252 are respectively output from the output end of the SOA 222 and the output end of the SOA 232 to the outside.

The SOAs 221, 222, 223, 231, 232, and 233 include the electrodes 47 of FIG. 28 that are electrically separated from each other and can be individually controlled by current. In other words, the SOAs 221, 222, and 223 have the same cross-sectional structure, but the SOA connecting waveguides 24 do not include an electrode. Thus, each of the electrodes of the SOAs 221, 222, and 223 are electrically separated from each other and can be individually controlled by current. Similarly, each of the electrodes of the SOAs 231, 232, and 233 are electrically separated from each other and can be individually controlled by current.

In addition, the two MMI output waveguides 5 have a length of about μm similarly to the SOA connecting waveguides 24, and have the same distance between the input ends as the distance between the output ends. The SOA 223 and the SOA 233 are provided such that a distance between the output ends thereof is greater than the input ends thereof, and the output ends are connected to the corresponding input ends of the SOA 221 and the SOA 231, so that a distance SD between the SOAs is greater than the distance between the input ends of the two MMI output waveguides 5. In other words, the first arm portion and the second arm portion have a distance therebetween greater than a distance MD between the input ends of the two MMI output waveguides 5.

With this configuration, the wavelength-tunable light source 200A is controlled to reduce the current densities of the SOAs 222, 223, 232, and 233 lower than the current densities of the SOAs 221 and 231, so that the thermal cross-talk at the output ends and the MMI output waveguides 5 is suppressed, and the increase in the power consumption can be suppressed. In FIG. 6, the SOAs having the high drive current densities have the dark hatching pattern, and the SOAs having the low drive current densities have the light hatching pattern.

In comparison with the wavelength-tunable light source 200 including the two-stage SOAs, the SOAs have the greater lengths in total by replacing most part of the MMI output waveguides 5 with the SOAs 223 and 233, so that the light output can be increased.

Figure 7:
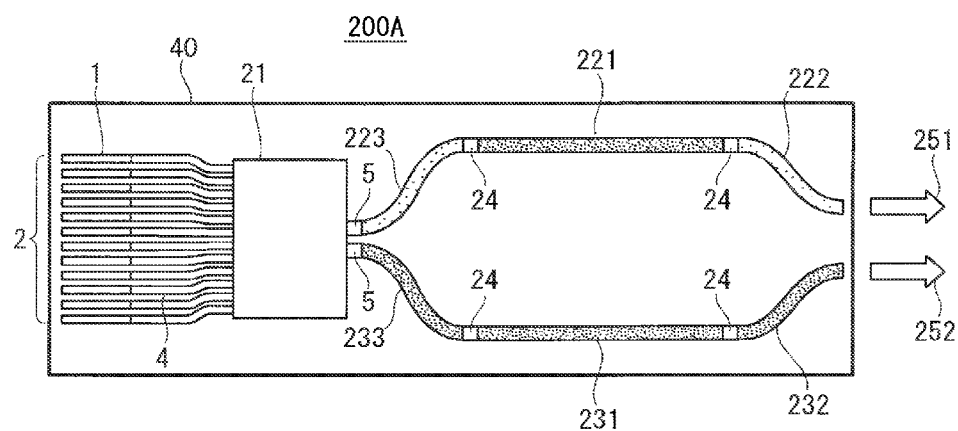

The example of reducing the current densities of the SOAs 222, 232, 223, and 233 is described above, but as shown in FIG. 7, for example, only the SOAs 222 and 223 may have the reduced current densities while the SOAs 232 and 233 may have the high current densities similarly to the SOA 231. In FIG. 7, the SOAs having the high drive current densities have the dark hatching pattern, and the SOAs having the low drive current densities have the light hatching pattern.

Such control makes the light output 251 lower than the light output 252, which causes no problem if the light output 251 is used for reception and the light output 252 is used for transmission.

Moreover, when the SOAs 222 and 233 have the current densities reduced and the other SOAs have the current densities increased, the light output 251 and the light output 252 are about the same.

Second Modification

Figure 8:
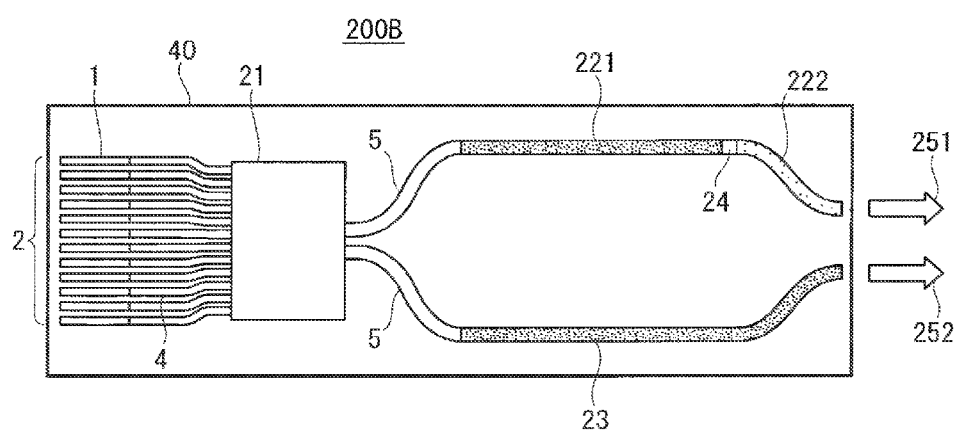
FIG. 8 is a plan view showing a configuration of a wavelength-tunable light source in a second modification of the second preferred embodiment of the present invention.

In a second modification of the second preferred embodiment, wavelength-tunable light source 200B shown in FIG. 8 may include one arm portion including a one-stage SOA and another arm portion including a two-stage SOA.

In other words, as shown in FIG. 8, the output ends of the two MMI output waveguides 5 are connected to corresponding input ends of the SOA 221 and the SOA 23 of the same waveguide type. The SOA 221 is connected in series to the SOA 222 through the SOA connecting waveguide 24 and the light output 251 is output from the output end of the SOA 222 to the outside. The SOA 23 is the one-stage type, so that the light output 252 is output from the output end of the SOA 23 to the outside.

Herein, the output ends of the SOAs 222 and 23 may be respectively referred to as an output end of a first output portion and an output end of a second output portion of the wavelength-tunable light source 200B. Traveling paths of light from the input ends of the two MMI output waveguides 5 to the output ends of the first output portion and the second output portion may be each referred to as a first arm portion and a second arm portion.

With this configuration, the wavelength-tunable light source 200B is controlled to reduce the current density of the SOA 222 lower than the current densities of the SOAs 221 and 23, which causes no problem if the light output 251 is used for reception and the light output 252 is used for transmission.

Hereinafter, the control of the wavelength-tunable light source 200 in this second preferred embodiment is further described. For example, a current density of each of the SOAs can be controlled with a current controller 70 shown in FIG. 9. In other words, the current controller 70 applies a different current to each electrode 47 (FIG. 28) of the SOAs 221 and 222 through a wire W221 and a wire W222 electrically connected to the electrodes 47, to thereby control the current densities of the SOAs and allow the light to be amplified. Similarly, the current controller 70 applies a different current to each electrode 47 (FIG. 28) of the SOAs 231 and 232 through a wire W231 and a wire W232 electrically connected to the electrodes 47, to thereby control the current densities of the SOAs and allow the light to be amplified. The wavelength-tunable light source 200 and the current controller 70 form part of the wavelength-tunable light source module.

Figure 10:
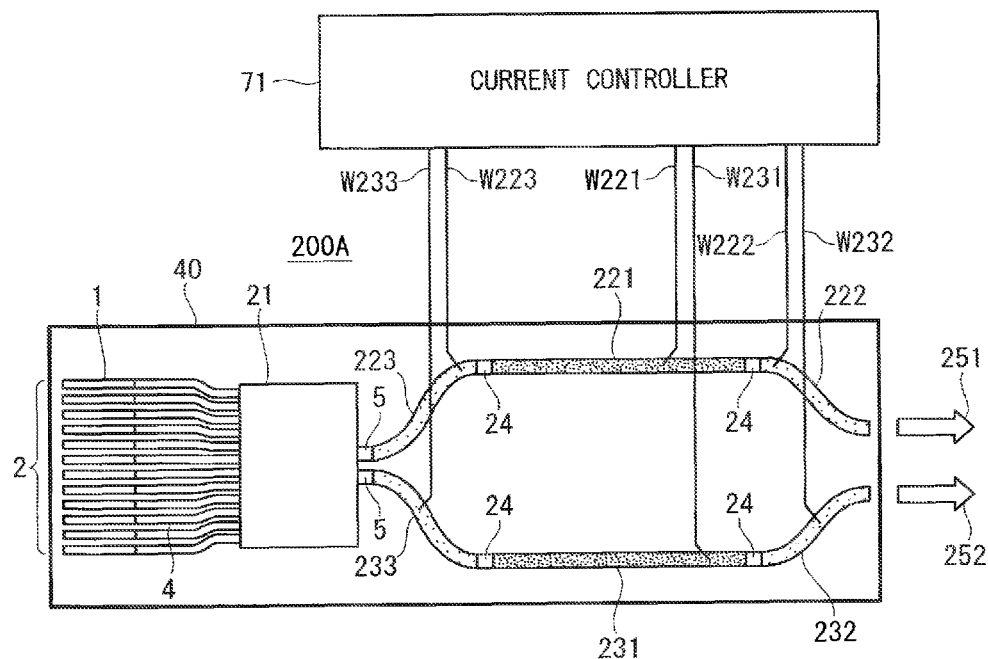

The control of the wavelength-tunable light source 200A in the first modification of this second preferred embodiment is further described. For example, a current density of each of the SOAs can be controlled with a current controller 71 shown in FIG. 10. In other words, the current controller 71 applies a different current to each electrode 47 (FIG. 28) of the SOAs 223, 221, and 222 through a wire W223, a wire W221, and a wire W222 electrically connected to the electrodes 47, to thereby control the current densities of the SOAs and allow the light to be amplified.

Similarly, the current controller 71 applies a different current to each electrode 47 (FIG. 28) of the SOAs 233, 231, and 232 through a wire W233, a wire W231, and a wire W232 electrically connected to the electrodes 47, to thereby control the current densities of the SOAs, and allow the light to be amplified. The current controller 71 shown in FIG. 10 enables the control described with reference to FIG. 7. The wavelength-tunable light source 200A and the current controller 71 form part of the wavelength-tunable light source module.

As to the control of the wavelength-tunable light source 200B in the second modification of this second preferred embodiment, current can be controlled also with the current controller 70 shown in FIG. 9. The current controller 70 applies a different current to each electrode 47 (FIG. 28) of the SOAs 221 and 222 through the wire W221 and the wire W222 electrically connected to the electrodes 47, to thereby control the current densities of the SOAs and to allow the light to be amplified. The current controller 70 applies a current to the electrode 47 (FIG. 28) of the SOA 23 (FIG. 8) through, for example, the wire W231, to thereby control the current density of the SOA and allow the light to be amplified.

As described above, the wavelength-tunable light source 200 in this second preferred embodiment and the wavelength-tunable light sources 200A and 200B in the first and second modifications further suppress the thermal cross-talk between the SOAs, allowing for lower power consumption.

Third Preferred Embodiment

The wavelength-tunable light source 200 in the second preferred embodiment includes the SOAs having the multistage configuration to further suppress the thermal cross-talk, which has been described above. The SOA having the multistage configuration includes an SOA being a subsequent stage that can light output ON and OFF.

In other words, as described with reference to FIG. 5, when a current is injected into the SOAs 221 and 222, the LD output light traveling through the MMI output waveguides 5 is amplified by the SOA 221, and the LD output light amplified by the SOA 221 is further amplified by the SOA 222 and is output as the light output 251. This also holds true for the other arm portion including the SOAs 231 and 232.

Herein, in a case where the current is injected into the SOA 221 and no current is injected into the SOA 222, the SOA 222 absorbs the LD output light and no light output 251 is thus output.

In this manner, the SOA 222 being the subsequent stage (final stage) has the function (shutter function) of turning the light output ON and OFF in addition to the function of amplifying the LD output light. This also holds true for the SOA 232 of the other arm portion, and the SOA being the subsequent stage (final stage) can turn ON and OFF the light output from the MMI output waveguide 5.

In a case where one of the arm portions performs ON/OFF control that repeatedly turns ON and OFF and the other arm portion is used in an ON state all the time in this configuration, changes in heat due to the ON/OFF control occur in one of the arm portions, and the heat transmitted to the other arm portion not only changes the light output of the other arm portion but also the heat reaching the DFB-LDs possibly changes an oscillation wavelength.

Figure 11:
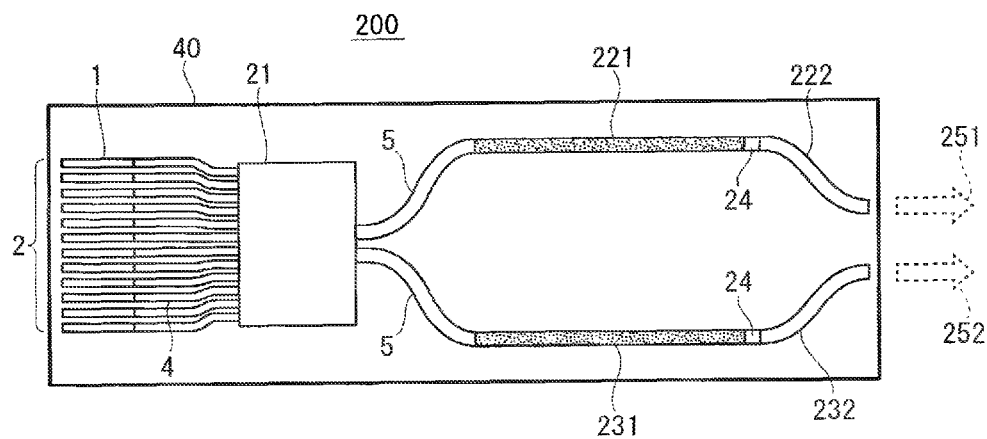
FIG. 11 is a plan view for describing a technique for controlling a wavelength-tunable light source in a third preferred, embodiment of the present invention.

Thus, as shown in FIG. 11, as a technique for controlling the wavelength-tunable light source 200 of the present invention, the SOAs 221 and 231 being preceding stages are injected with current all the time and are turned ON regardless of whether the ON/OFF control is performed on the light output, and the SOAs 222 and 232 being the subsequent stages are turned ON and OFF when the ON/OFF control is performed. This suppresses the changes in heat, and thus the changes in the light output and the oscillation wavelength can be suppressed.

Figure 12:
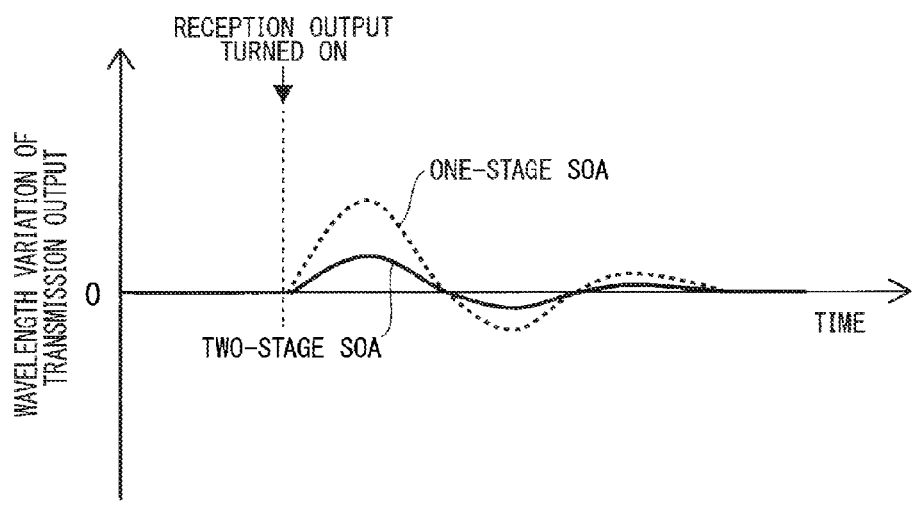
FIG. 12 shows variation characteristics of wavelengths of transmission outputs when reception outputs are in an ON state.

FIG. 12 shows variation characteristics of wavelengths of transmission outputs when reception outputs are in an ON state. The horizontal axis represents a time axis and the vertical axis represents variations in wavelengths of the transmission outputs. In FIG. 12, characteristics of the one-stage SOA shown in FIG. 1 are indicated by a broken line, and characteristics of the two-stage SOA shown in FIG. 1 are indicated by a solid line.

As shown in FIG. 12, when the reception outputs are turned ON, the wavelengths of the transmission outputs start to vary, but by monitoring the wavelengths and controlling temperatures of the DFB-LDs, the wavelength variations become zero as the time passes. In comparison with the one-stage SOA shown in FIG. 1 clear that the wavelength variations of the transmission output in the configuration of the two-stage SOA shown in FIG. 1 are suppressed by performing the ON/OFF control with the SOA being the subsequent stage while the SOA being the preceding stage is injected with current all the time and is turned ON.

Figure 13:
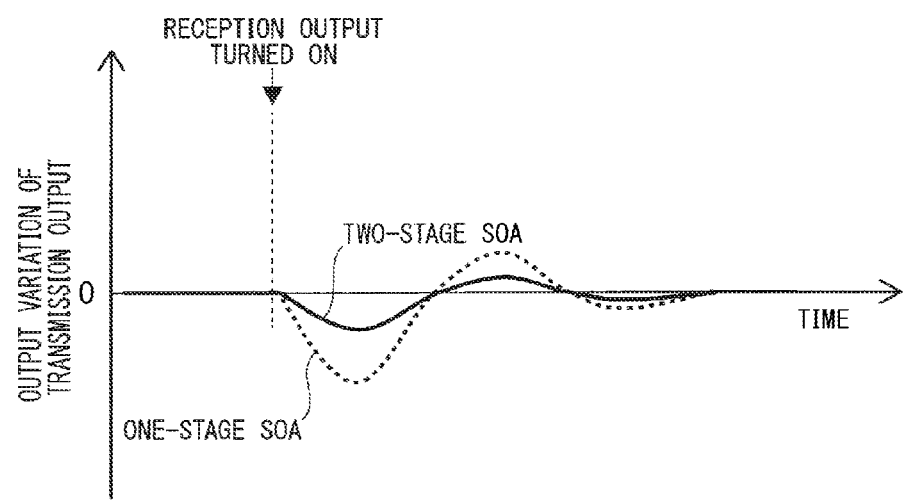
FIG. 13 shows variation characteristics of outputs of the transmission outputs when the reception outputs are in the ON state.

FIG. 13 shows variation characteristics of output intensity of the transmission outputs when the reception outputs are in the ON state. The horizontal axis represents a time axis and the vertical axis represents variations of the output intensity of the transmission outputs. In FIG. 13, characteristics of the one-stage SOA shown in FIG. 1 are, indicated by a broken line, and characteristics of the two-stage SOA shown in FIG. 11 are indicated by a solid line.

As shown in FIG. 13, when the reception outputs are turned ON, the output intensity of the transmission outputs starts to vary, but by monitoring the wavelengths and controlling temperatures of the DFB-LDs, the output variations become zero as the time passes. In the configuration of the two-stage SOA shown in FIG. 11 compared to the one-stage SOA shown in FIG. 1, it is clear that the output variations of the transmission output are suppressed by injecting current into the SOA being the preceding stage all the time to turn ON the SOA and by performing the ON/OFF control with the SOA being the subsequent stage.

For further description of the control technique in this third preferred embodiment, for example, a current density of each of the SOAs can be individually controlled with the current controller 70 shown in FIG. 9.

In other words, to successively produce light output, the current controller 70 applies current to all of the SOAs 221, 222, 231, and 232 through the wires W221, W222, W231, and W232 to turn ON the SOAs 221, 222, 231, and 232, to thereby control the current densities and amplify the light. For switching ON and OFF of the light output, the current controller 70 enables the switching by applying current to the SOA 222 and the SOA 232 being the subsequent stages respectively through the wires W222 and W232 or by interrupting current.

The switching ON and OFF of the light output can be repeatedly performed at the timing, which does not interrupt the transmission and reception, at predetermined intervals (the order of msec or μsec). Moreover, the ON/OFF control can also be performed on only one of the arm portions used when transmission or reception is not performed. If the switching ON and OFF of the light output suppresses (stabilizes) the wavelength variations of the output and the variations of the output intensity as shown in FIGS. 12 and 13, the SOA can also be controlled to be in the ON state all the time while the ON/OFF control is released.

Fourth Preferred Embodiment

FIG. 14 is a plan view showing a configuration of a wavelength-tunable light source 100C in a fourth preferred embodiment of the present invention. As shown in FIG. 14, the wavelength-tunable light source 100C includes an absorption layer 80 along each of the first arm portion (formed of the MMI output waveguide 5 and the SOA 22) and the second arm portion (formed of the MMI output waveguide 5 and the SOA 23).

The absorption layer 80 is provided in the region between the first arm portion and the second arm portion and absorbs emitted light in the planar direction (direction parallel to a main surface of the substrate 40) from the first and second arm portions.

The emitted light generated from the first and second arm portions and transmitted in the wavelength-tunable light source 100C becomes the light reflected back to the DFB-LD array 2, thereby degrading, a laser oscillation line width as an indicator of stability of a phase.

As described above, the wavelength division multiplexing communication system adopting the digital coherent communication includes the narrow-line-width wavelength-tunable light source as a light source for transmission and reception, and degradation (increase) in the laser oscillation line width is not desired and generation of the emitted light from the arm portions needs to be suppressed. Thus, the absorption layer 80 can reduce the laser oscillation line width from 600 kHz to 500 kHz in the wavelength-tunable light source 100C.

FIG. 15 is a cross-sectional view taken along a B-B line of FIG. 14. As shown in FIG. 15, the absorption layer 80 is provided on the InP lower clad layer 41 and in parallel to the InGaAsP active layer 45, and the absorption layer 80 can absorb emitted light (schematically indicated by an arrow) from the InGaAsP active layer 45. Portions of the absorption layer 80 along the MMI output waveguides 5 are provided in parallel to the InGaAsP waveguide layer 42 (FIG. 27).

The absorption layer 80 is made of the same material (InGaAsP) and in the same steps as those of the InGaAsP active layer 45 and the InGaAsP waveguide layer 42 (FIG. 27), but the InGaAsP contact layer 46 and the electrode 47 are not provided above the absorption layer 80, as shown in FIG. 15, since no current is applied to the absorption layer 80.

In addition, FIG. 14 shows the configuration in which the absorption layer 80 is provided in the region between the first and second arm portions, but the absorption layer 80 may be provided in a region outside the first and second arm portions or may be provided in both of the region between the first and second arm portions and the region outside the first and second arm portions. Further, the absorption layer 80 may be provided along only one of the first arm portion and the second arm portion.

First Modification

The wavelength-tunable light source 100C in the fourth preferred embodiment described above has the configuration in which the absorption layer 80 is provided along each of the first and second arm portions. As in a wavelength-tunable light source 100D shown in FIG. 16, an absorption layer 81 may be linearly provided in the middle portion between the first and second arm portions across the entire region in which the first and second arm portions extend. Also in this case, the absorption layer 81 can absorb the emitted light in the planar direction from the first and second arm portions.

Figure 16:
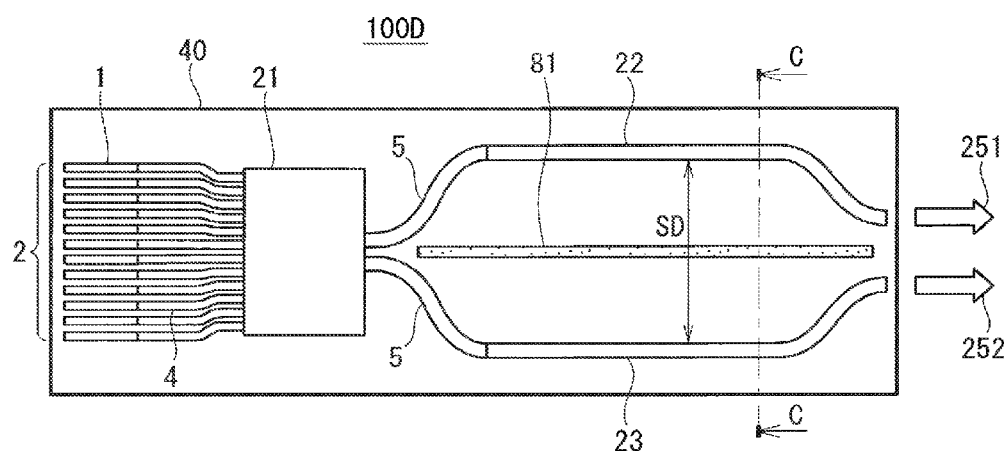
FIG. 16 is a plan view showing a configuration of a wavelength-tunable light source in a first modification of the fourth preferred embodiment of the present invention.
Figure 17:
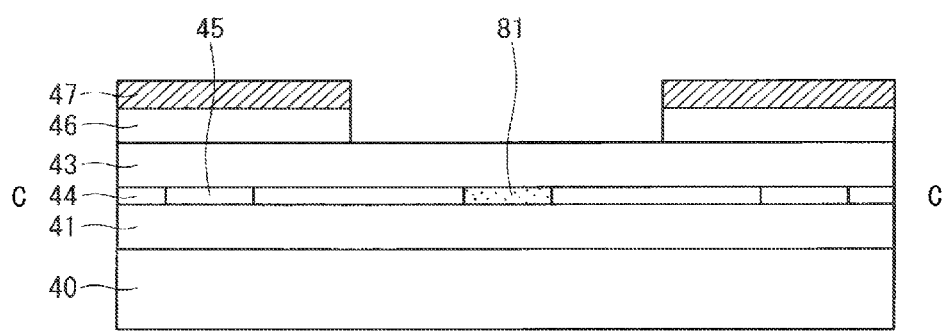
FIG. 17 is a cross-sectional view showing the configuration of the wavelength-tunable light source in the first modification of the fourth preferred embodiment of the present invention.

FIG. 17 is a cross-sectional view taken along a C-C line of FIG. 16. As shown in FIG. 17, the InGaAsP contact layer 46 and the electrode 47 are not provided above the absorption layer 81.

The absorption layer 80 may have a width to the extent that the absorption layer 80 does not contact the SOAs 22 and 23, that is to say, the absorption layer 80 may have a width increased to the same size as the distance SD between the SOAs.

Second Modification

The wavelength-tunable light source 100C in the fourth preferred embodiment has the configuration in which the absorption layer 80 is provided along each of the first and second arm portions. As in a wavelength-tunable light source 100E shown in FIG. 18, grooves TR may be provided instead of the absorption layer 80.

As shown in FIG. 18, the grooves TR are each provided along the first arm portion and the second arm portion.

The grooves TR are provided in the region between the first and second arm portions, reflect emitted light in the planar direction (direction parallel to the main surface of the substrate 40) from the first and second arm portions, and emit the light to the outside of the wavelength-tunable light source 100E. The grooves TR can reduce a laser oscillation line width from 600 kHz to 400 kHz.

FIG. 19 is a cross-sectional view taken along a D-D line of FIG. 18. As shown in FIG. 19, the groove TR is provided so as to penetrate the electrode 47, the InGaAsP contact layer 46, the InP upper clad layer 43, the InP current block layer 44, and the InP lower clad layer 41 and to expose the main surface of the InP substrate 40. The groove TR can reflect the emitted light (schematically indicated by an arrow) from the InGaAsP active layer 45. Portions of the grooves TR along the MMI output waveguides 5 are provided in parallel to the InGaAsP waveguide layer 42 (FIG. 27).

The grooves TR can be formed, by etching with a freely-selected mask pattern.

In addition, FIG. 19 shows the configuration in which the grooves TR are provided in the region between the first and second min portions, but the grooves TR may be provided in a region outside the first and second arm portions or may be provided in both of the region between the first and second arm portions and the region outside the first and second arm portions. Further, the groove TR may be provided along only one of the first arm portion and the second arm portion.

Third Modification

The wavelength-tunable light source 100E in the second modification has the configuration in which the grooves TR are each provided along the first and second arm portions. As in a wavelength-tunable light source 100F shown in FIG. 20, a groove TR1 may be linearly provided in the middle portion between the first and second arm portions across the entire region in which the first and second arm portions extend. Also in this case, the groove TR1 can reflect the emitted light in the planar direction from the first and second arm portions.

Figure 20:
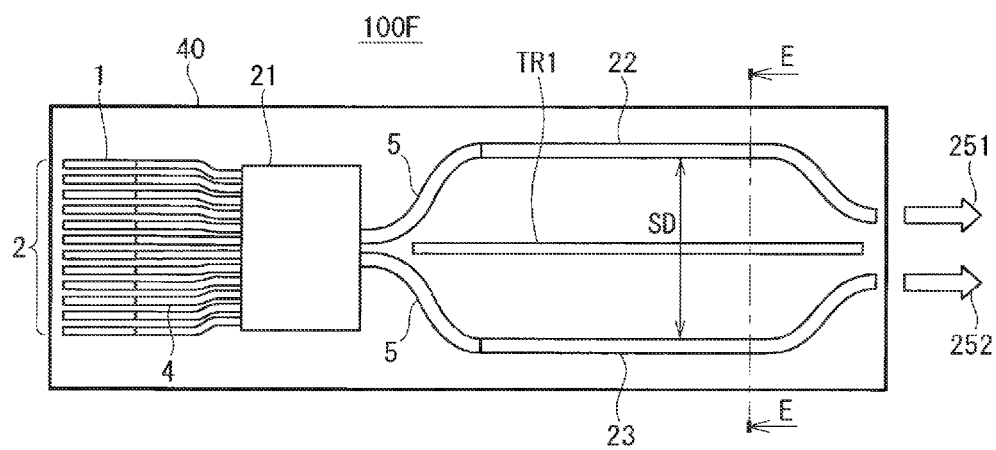
FIG. 20 is a plan view showing a configuration of a wavelength-tunable light source in a third modification of the fourth preferred embodiment of the present invention.
Figure 21:
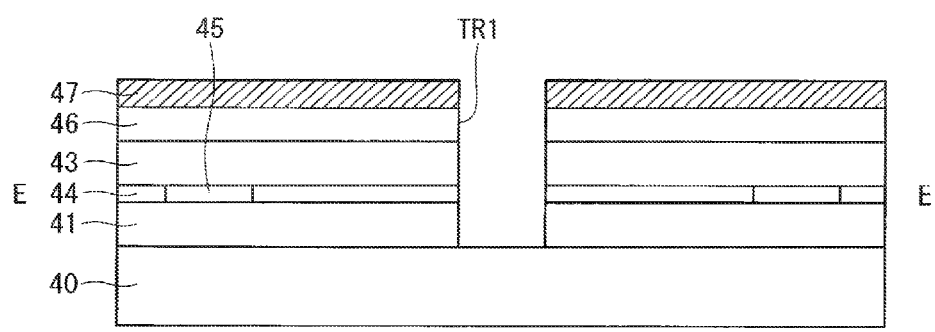
FIG. 21 is a cross-sectional view showing the configuration of the wavelength-tunable light source in the third modification of the fourth preferred embodiment of the present invention.

FIG. 21 is a cross-sectional view taken along an E-E line of FIG. 20. As shown in FIG. 21, the groove TR1 is provided so as to penetrate the electrode 47, the InGaAsP contact layer 46, the InP upper clad layer 43, the InP current block layer 44, and the InP lower clad layer 41 and to expose the main surface of the InP substrate 40.

The groove TR1 may have a width to the extent that the groove TR1 does not contact the SOAs 22 and 23, that is to say, the groove TR1 may have a width increased to the same size as the distance SD between the SOAs.

Fifth Preferred Embodiment

The first to fourth preferred embodiments described above show the example of the configuration of the wavelength-tunable light source including the DFB-LDs, but a wavelength-tunable light source may include a DBR-LD. For the DFB-LDs, the plurality of DFB-LDs having different oscillation wavelengths are combined and the temperature is controlled, thereby achieving to adjust wavelengths. For the DBR-LD, an amount of current injected into the single DBR-LD is adjusted and an equivalent refractive index of a DBR is controlled, thereby achieving to adjust wavelengths.

Figure 22:
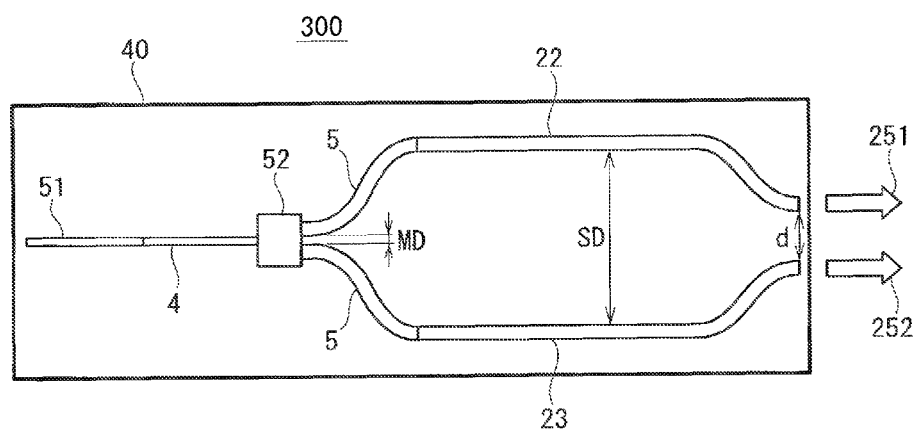
FIG. 22 is a plan view showing a configuration of a wavelength-tunable light source in a fifth preferred embodiment of the present invention.

FIG. 22 is a plan view showing an example of a configuration of a wavelength-tunable light source 300 in a fifth preferred embodiment of the present invention. The wavelength-tunable light source 300 is different from the wavelength-tunable light source 100 in the first preferred embodiment in that the wavelength-tunable light source 300 includes a DBR-LD 51 instead of the DFB-LD array 2 and includes a 1×2-MMI 52 instead of the 12×2-MMI 21. The other components that are the same as those in FIG. 1 are denoted by the same references, and their redundant description will be omitted.

In the wavelength-tunable light source 300, the light output from the DBR-LD 51 is bifurcated into two by the 1×2-MMI 52, and each light is amplified by the SOA and is output.

Similarly to the wavelength-tunable light source 100, the wavelength-tunable light source 300 also has the configuration in which the distance SD between the SOAs 22 and 23 is greater than the distance MD between the input ends of the two MMI output waveguides 5 and greater than the distance d between the output ends of the SOAs 22 and 23, so that the distance SD between the SOAs is relatively great and the thermal cross-talk between the SOAs can be suppressed, allowing for low power consumption.

First Modification

Figure 23:
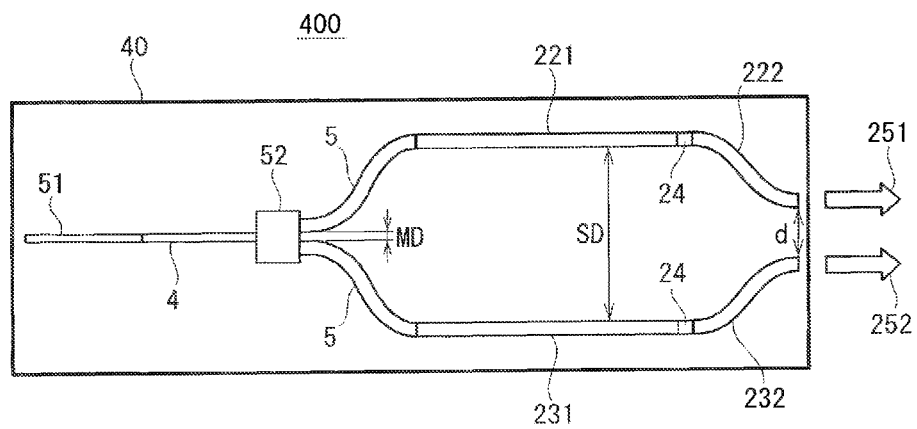
FIG. 23 is a plan view showing a configuration of a wavelength-tunable light source in a first modification of the fifth preferred embodiment of the present invention.

Similarly to the wavelength-tunable light source 200 in the second preferred embodiment, SOAs may be two-stage SOAs. FIG. 23 is a plan view showing an example of a configuration of a wavelength-tunable light source 400 including the two-stage SOAs. With the two-stage SOAs as shown in FIG. 23, drive current densities of the SOAs including the output portions are reduced, so that the thermal cross-talk can be further suppressed and power consumption is reduced, allowing for low power consumption.

Second Modification

A number of stages of SOAs is not limited to two stages. With three-stage SOAs similarly to the wavelength-tunable light source 200A shown in FIG. 6, the thermal cross-talk is suppressed at the output ends of the SOAs and at the MMI output waveguides 5, and an increase in power consumption can be suppressed.

Application to Wavelength-Tunable Light Source Module

Figure 24:
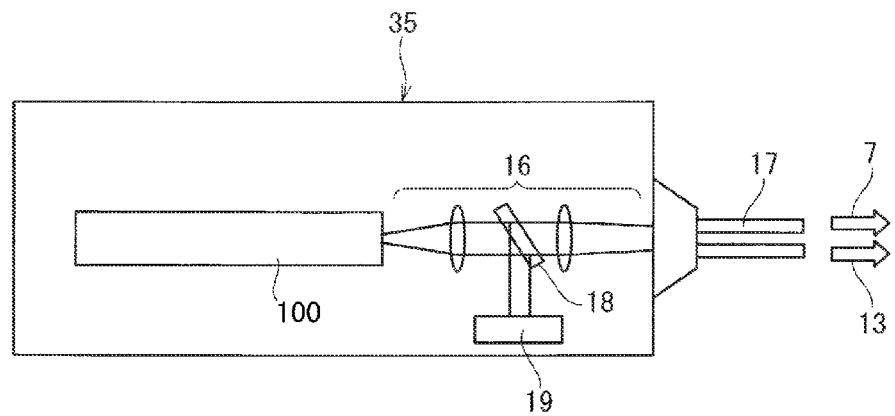
FIG. 24 shows a configuration of a wavelength-tunable light source module to which the wavelength-tunable light source of the present invention is applied as a light source.

FIG. 24 shows a configuration to which the wavelength-tunable light source 100 in the first preferred embodiment shown in FIG. 1 is applied as a wavelength-tunable light source in a wavelength-tunable light source module 35. The other components and operations of the wavelength-tunable light source module 35 are the same as those of the wavelength-tunable light source module 9 described with reference to FIG. 9. The same components are denoted by the same references, and their redundant description will be omitted.

As shown in FIG. 24, the wavelength-tunable light source module 35 includes two optical fibers 17 as output ports. The light output 251 and the light output 252 (FIG. 1) emitted from the wavelength-tunable light source 100 are each coupled to the two optical fibers 17 through the coupling optical system 16 and can be used as the transmission light output 7 and the reception light output 13.

FIG. 24 shows the example in which the two optical fibers are applied as the output ports, but a 2-conductor fiber having two cores in one optical fiber may be applied. This only needs one optical fiber for adjusting a position of a conductor, and time for assembly can be shortened. A tip of the 2-conductor fiber is bifurcated into two without a loss and is taken out as a transmission light output and a reception light output.

As described above, the example in which the wavelength-tunable light source 100 in FIG. 9 is applied as a wavelength-tunable light source is shown, but the wavelength-tunable light source each shown in FIGS. 2, 5 to 8, 14, 16, 18, 20, 22, and 23 may be applied as the wavelength-tunable light source.

In the wavelength-tunable light source module 35 described above, the two light output emitted from the wavelength-tunable light source 100 is coupled to the output ports. This eliminates the need for a polarization maintaining coupler having a branch loss, and drive current densities of SOAs can be reduced, allowing for low power consumption and reduced space compared to the case in which the polarization maintaining coupler is provided.

<Application to Transceiver>

Figure 25:
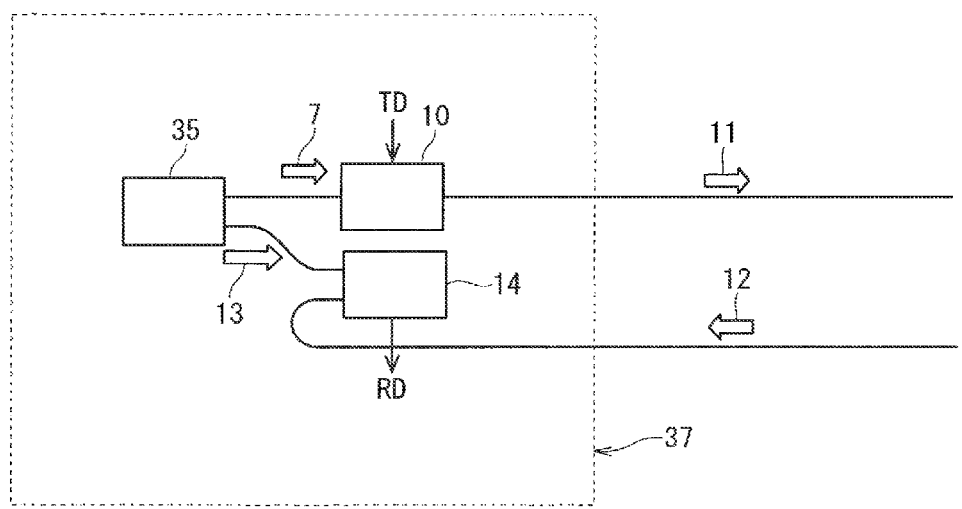
FIG. 25 shows a configuration to which the wavelength-tunable light source module including the wavelength-tunable light source of the present invention is applied as a light source module in a transceiver.

FIG. 25 shows a configuration to which the wavelength-tunable light source module 35 shown in FIG. 24 is applied as a light source module in a transceiver 37.

In the transceiver 37 as shown in FIG. 25, the transmission light output 7 output from the wavelength-tunable light source module 35 is modulated by the modulator module 10 based on transmit data TD and is subsequently output as the transmission signal 11 to the outside.

The reception signal 12 is input from the outside to the reception module 14 together with the reception light output 13 output from the wavelength-tunable light source module 35, is demodulated after signal processing, and is output as received data RD from the reception module 14.

In this manner, the wavelength-tunable light source module 35 can be used as a light source module for transmission and reception. This eliminates the need for the polarization maintaining coupler, which allows for low power consumption and reduced space compared to a transceiver including two wavelength-tunable light source modules.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:
1. A wavelength-tunable light source, comprising:
an optical coupling circuit that has an input portion connected to an output end of at least one input waveguide, has output portions connected to input ends of two output waveguides, and outputs light input from said at least one input waveguide to said two output waveguides;

a semiconductor laser connected to an input end of said at least one input waveguide;
a first optical amplifier and a second optical amplifier connected to corresponding output ends of said two output waveguides; and
a first output portion and a second output portion respectively outputting the light passing through said first optical amplifier and said second optical amplifier, wherein
a first arm portion and a second arm portion have an arrangement distance therebetween greater than a distance between said input ends of said two output waveguides and greater than a distance between an output end of said first output portion and an output end of said second output portion, said first arm portion forming a traveling path of light from one of said two output waveguides to said first output portion through said first optical amplifier, said second arm portion forming a traveling path of light from the other one of said two output waveguides to said second output portion through said second optical amplifier, and
said first optical amplifier and said second optical amplifier have curved portions in which said first output portion and said second output portion are curved in a direction toward each other, and said first optical amplifier and said second optical amplifier respectively output light from said output end of said first output portion and said output end of said second output portion.

2. The wavelength-tunable light source according to claim 1, wherein at least one of said first optical amplifier and said second optical amplifier has a multistage configuration including a plurality of optical amplifiers connected in series, said plurality of optical amplifiers being individually controllable.

3. The wavelength-tunable light source according to claim 2, wherein
said two output waveguides are provided such that a distance between the output ends of said two output waveguides is greater than a distance between the input ends thereof, and
a final-stage optical amplifier of one of said first optical amplifier and said second optical amplifier having said multistage configuration and the other one of said first optical amplifier and said second optical amplifier have curved portions in which said first output portion and said second output portion are curved in the direction toward each other.

4. The wavelength-tunable light source according to claim 2, wherein
said two output waveguides are provided such that a distance between the output ends of said two output waveguides is the same as a distance between the input ends thereof,
said first optical amplifier and said second optical amplifier have said multistage configuration, and
said first optical amplifier and said second optical amplifier each include a first-stage optical amplifier provided such that a distance between output ends of the first-stage optical amplifiers is greater than a distance between input ends thereof.

5. A wavelength-tunable light source module, comprising:
the wavelength-tunable light source according to claim 2; and
a current controller of optical amplifiers, wherein
said first optical amplifier and said second optical amplifier have said multistage configuration, and
said current controller controls current such that a pair of optical amplifiers having a distance therebetween shorter than said arrangement distance have a drive current density lower than that of a pair of optical amplifiers keeping said arrangement distance in said first optical amplifier and said second optical amplifier.

6. A wavelength-tunable light source module, comprising:
the wavelength-tunable light source according to claim 2; and
a current controller of optical amplifiers, wherein
said first optical amplifier and said second optical amplifier have said multistage configuration, and
said current controller controls current such that one of a pair of optical amplifiers having a distance therebetween shorter than said arrangement distance has a drive current density lower than that of a pair of optical amplifiers keeping said arrangement distance in said first optical amplifier and said second optical amplifier.

7. A wavelength-tunable light source module, comprising:
the wavelength-tunable light source according to claim 2; and
a current controller of optical amplifiers, wherein
at least one of said first optical amplifier and said second optical amplifier has said multistage configuration, and
said current controller performs current control whether a current is injected into a final-stage optical amplifier of said first optical amplifier or said second optical amplifier having said multistage configuration to control ON and OFF of light output from said first output portion and said second output portion.

8. The wavelength-tunable light source according to claim 1, wherein
said wavelength-tunable light source is formed on a semiconductor substrate, and
said arrangement distance is set greater than a thickness of said semiconductor substrate.

9. The wavelength-tunable light source according to claim 1, wherein said wavelength-tunable light source is formed in a semiconductor laminated film laminated on a semiconductor substrate,
said wavelength-tunable light source further comprising an absorption layer that is provided along at least one of said first arm portion and said second arm portion and that absorbs emitted light from said first arm portion and said second arm portion, said absorption layer being located in the same layer and comprising the same material as said first arm portion and said second arm portion.

10. The wavelength-tunable light source according to claim 1, wherein said wavelength-tunable light source is formed in a semiconductor laminated film laminated on a semiconductor substrate,
said wavelength-tunable light source further comprising an absorption layer that is linearly provided in a middle portion between said first arm portion and said second arm portion across the entire region in which said first arm portion and said second arm portion extend and that absorbs emitted light from said first arm portion and said second arm portion, said absorption layer being located in the same layer and comprising the same material as said first arm portion and said second arm portion.

11. The wavelength-tunable light source according to claim 1, wherein said wavelength-tunable light source is formed in a semiconductor laminated film laminated on a semiconductor substrate, said wavelength-tunable light source further comprising a groove provided along at least one of said first arm portion and said second arm portion so as to penetrate said semiconductor laminated layer to reach said semiconductor substrate.

12. The wavelength-tunable light source according to claim 1, wherein said wavelength-tunable light source is formed in a semiconductor laminated film laminated on a semiconductor substrate, said wavelength-tunable light source further comprising a groove that is linearly provided in a middle portion between said first arm portion and said second arm portion across the entire region in which said first arm portion and said second arm portion extend and that penetrates said semiconductor laminated film to reach said semiconductor substrate.

13. A wavelength-tunable light source module, comprising the wavelength-tunable light source according to claim 1, wherein a first light output and a second light output respectively output from said output end of said first output portion and said output end of said second output portion are coupled to an optical fiber through a coupling optical system, and said first light output is a transmission light output and said second light output is a reception light output.

* * * * *